US012677567B2

(12) United States Patent     (10) Patent No.:   US 12,677,567 B2
Kim et al.     (45) Date of Patent:     Jul. 7, 2026

(54) DISPLAY DEVICE AND METHOD OF MANUFACTURING THE SAME

(71) Applicant: Samsung Display Co., Ltd., Yongin-si (KR)

(72) Inventors: Boseong Kim, Hongseong-gun (KR); Sungchul Kim, Busan (KR); Yong-Hyun Hwang, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 738 days.

(21) Appl. No.: 17/982,992

(22) Filed: Nov. 8, 2022

(65) Prior Publication Data

US 2023/0247852 A1     Aug. 3, 2023

(30) Foreign Application Priority Data

Feb. 3, 2022    (KR) ......................... 10-2022-0014286

(51) Int. Cl.
    *H01L 51/52*       (2006.01)
    *H01L 27/32*       (2006.01)
            (Continued)

(52) U.S. Cl.
    CPC ......... *H10K 59/873* (2023.02); *H05K 1/0218* (2013.01); *H05K 1/0269* (2013.01);             (Continued)

(58) Field of Classification Search
    CPC ....... H05K 1/0269; H05K 2201/09918; H05K 2201/09927; H01L 23/544;             (Continued)

(56) References Cited

U.S. PATENT DOCUMENTS 5,405,810 A   *   4/1995   Mizuno ................. H01L 23/544
                                   257/E23.179
11,254,093 B2     2/2022   Lee et al.
            (Continued)

FOREIGN PATENT DOCUMENTS

CN      114695493 A   *   7/2022   ............. H01L 21/78
EP       4006966 A1   *   6/2022   ........... H05K 1/0269
            (Continued)

OTHER PUBLICATIONS

Machine translation, Chen, Chinese Pat. Pub. No. CN114695493A, translation date: Oct. 24, 2025, Espacenet, all pages. (Year: 2025).*
            (Continued)

*Primary Examiner* — Victoria K. Hall

(74) *Attorney, Agent, or Firm* — CANTOR COLBURN LLP

(57) ABSTRACT

A display device includes: a display panel and a circuit board. The circuit board includes a base layer, a circuit pattern disposed on the base layer and electrically connected to the display panel, an alignment pattern disposed on the base layer and including the same material as the circuit pattern, a first cover layer disposed on the base layer, covering the circuit pattern, and provided with a first opening defined therethrough to expose the alignment pattern, and a second cover layer disposed on the first cover layer, provided with a second opening defined therethrough and overlapping the first opening, and including a barcode pattern defined on a surface of the second cover layer opposite to the first cover layer. The first cover layer overlapping the second opening is exposed through the second opening without being covered by the second cover layer.

12 Claims, 22 Drawing Sheets

(51) Int. Cl.

| | |
|---|---|
| *H01L 51/56* | (2006.01) |
| *H05K 1/02* | (2006.01) |
| *H10K 50/80* | (2023.01) |
| *H10K 59/40* | (2023.01) |
| *H10K 59/80* | (2023.01) |
| *H10K 71/00* | (2023.01) |
| *H10K 71/10* | (2023.01) |
| *H10K 77/10* | (2023.01) |
| *H10W 46/00* | (2026.01) |
| *H05K 1/189* | (2026.01) |

(52) U.S. Cl.

CPC ............. *H10K 50/80* (2023.02); *H10K 59/40* (2023.02); *H10K 71/00* (2023.02); *H10K 71/191* (2023.02); *H10K 77/10* (2023.02); *H10W 46/00* (2026.01); *H05K 1/189* (2013.01); *H05K 2201/09918* (2013.01); *H05K 2201/09927* (2013.01); *H05K 2201/10128* (2013.01); *H10W 46/106* (2026.01); *H10W 46/301* (2026.01); *H10W 46/607* (2026.01)

(58) Field of Classification Search

CPC . H01L 2223/54413; H01L 2223/54426; H01L 2223/54433–54486; H10W 46/00–607

See application file for complete search history.

(56) References Cited

U.S. PATENT DOCUMENTS

| | | |
|---|---|---|
| 11,355,447 B2 | 6/2022 | Yang et al. |
| 11,366,538 B2 | 6/2022 | Kim et al. |

| | | | | |
|---|---|---|---|---|
| 2009/0233413 A1* | 9/2009 | Katayama | .......... | H10P 90/1914 |
| | | | | 257/E21.328 |
| 2020/0254721 A1* | 8/2020 | Lee | ........................... | B32B 5/18 |
| 2020/0319729 A1* | 10/2020 | Yang | ..................... | G06F 3/0443 |
| 2021/0057232 A1* | 2/2021 | Pio | ........................ | H01L 21/561 |
| 2021/0191551 A1* | 6/2021 | Kim | ..................... | G06F 3/0412 |

FOREIGN PATENT DOCUMENTS

| | | | | | |
|---|---|---|---|---|---|
| JP | 2009218379 A | | 9/2009 | | |
| KR | 100173249 B1 | | 5/1999 | | |
| KR | 1020060033075 A | | 4/2006 | | |
| KR | 101302122 B1 | | 8/2013 | | |
| KR | 1020190074101 A | | 6/2019 | | |
| KR | 1020200098807 A | | 8/2020 | | |
| KR | 10-2020-0118930 A | * | 10/2020 | ............. | G06F 3/041 |
| KR | 1020210078597 A | | 6/2021 | | |
| WO | 2021020471 A1 | | 2/2021 | | |

OTHER PUBLICATIONS

Korean Intellectual Property Office (KIPO), Request for the Submission of an Opinion, Korean Pat. App. No. KR10-2022-0014286, Jun. 27, 2025, all pages. (Year: 2025).*

Korean Intellectual Property Office, Written Decision on Registration, Application No. 10-2022-0014286, Dec. 19, 2025, all pages. (Year: 2025).*

\* cited by examiner

FIG. 10C

ISL—I
SDL—I } CL2—I
CL1—I
BF
II'
CP
AP
II

PCB

ISL
SDL } CL2
CL1
BF
II'
CP
AP
OP1
OP2
II

DR2
DR3
DR1

DISPLAY DEVICE AND METHOD OF MANUFACTURING THE SAME

This application claims priority to Korean Patent Application No. 10-2022-0014286, filed on Feb. 3, 2022, and all the benefits accruing therefrom under 35 U.S.C. § 119, the content of which in its entirety is herein incorporated by reference.

BACKGROUND

1. Field of Disclosure

The present disclosure relates to a display device and a method of manufacturing the same. More particularly, the present disclosure relates to a display device having a barcode pattern and a method of manufacturing the display device including a method of forming the barcode pattern.

2. Description of the Related Art

A display device includes a display module including an active area that is activated and a non-active area. The display module includes a display panel for displaying an image to a user and an input circuit sensing a user input. The display panel and the input circuit receive signals from an outside or transmit signals generated thereby to the outside. The display panel and the input circuit transmit or receive electrical signals via a circuit board. Signal lines or driving elements are arranged on the circuit board. As display devices of various shapes are being developed, circuit boards used in the display devices are also diversified.

SUMMARY

The present disclosure provides a display device including an alignment pattern with reduced defect rate and having a barcode pattern formed based on the alignment pattern.

The present disclosure provides a method of manufacturing the display device.

Embodiments of the inventive concept provide a display device including a display panel and a circuit board connected to the display panel. The circuit board includes a base layer, a circuit pattern disposed on the base layer and electrically connected to the display panel, an alignment pattern disposed on the base layer and including the same material as the circuit pattern, a first cover layer disposed on the base layer, covering the circuit pattern, and provided with a first opening defined therethrough to expose the alignment pattern, and a second cover layer disposed on the first cover layer, provided with a second opening defined therethrough and overlapping the first opening, and including a barcode pattern defined on a surface of the second cover layer opposite to the first cover layer. The first cover layer overlapping the second opening is exposed through the second opening without being covered by the second cover layer.

The alignment pattern may be spaced apart from the first cover layer, and a part of the base layer overlapping the first opening may be exposed through the first opening without being covered by the first cover layer.

The alignment pattern may have a brightness different from a brightness of the base layer.

An inner side surface of the first cover layer, which defines the first opening, may surround the alignment pattern.

The alignment pattern may have at least one of a circular shape and a polygonal shape in a plan view, and the polygonal shape may include a first side and a second side perpendicular to the first side.

The alignment pattern may be provided in plural, the alignment patterns may include a first pattern extending in a first direction and a second pattern extending in a second direction crossing the first direction and spaced apart from the first pattern, at least a portion of the first pattern may overlap the barcode pattern in the second direction, and at least a portion of the second pattern may overlap the barcode pattern in the first direction.

Each of the first opening and the second opening may be provided in plural, the first openings may include a first sub-opening through which the first pattern is exposed and a second sub-opening through which the second pattern is exposed, and the second openings may include a third sub-opening overlapping the first sub-opening and a fourth sub-opening overlapping the second sub-opening.

Each of the first opening and the second opening may have one of a quadrangular shape, a pentagon shape, and a circular shape in a plan view.

Each of the circuit pattern and the alignment pattern may include a metal material.

The first cover layer may include an organic insulating material.

The second cover layer may include a shielding layer disposed on the first cover layer and including a metal material and an insulating layer disposed on the shielding layer and including an organic insulating material.

The barcode pattern may be defined by a portion of the insulating layer, which is exposed by removing at least a portion of the insulating layer.

A minimum distance between the alignment pattern and the barcode pattern may be equal to or greater than about 1.0 millimeters (mm).

Embodiments of the inventive concept provide a method of manufacturing a display device. The method includes providing a circuit board including a base layer, an alignment pattern disposed on the base layer, a first cover layer disposed on the base layer and provided with a first opening defined therethrough to expose the alignment pattern, and a second cover layer disposed on the first cover layer and provided with a second opening defined therethrough and overlapping the first opening, connecting the circuit board to a display panel, and forming a barcode pattern in the circuit board based on the alignment pattern.

The forming of the barcode pattern may include setting a reference point based on the alignment pattern and recognizing, by a detection device, the reference point to form the barcode pattern.

The alignment pattern may include a first side and a second side perpendicular to the first side, and the reference point may be set as an intersection of a first imaginary reference line extending along the first side and a second imaginary reference line extending along the second side in the setting of the reference point.

The alignment pattern may have a circular shape in a plan view, and in the setting of the reference point the reference point may be set as a center of the alignment pattern or as one of vertices of a quadrangular shape of which an inscribed circle is the alignment pattern.

The alignment pattern may be provided in plural, the alignment patterns may include a first pattern extending in a first direction and a second pattern extending in a second direction crossing the first direction and spaced apart from the first pattern, and in the setting of the reference point the reference point may be set as an intersection of a first imaginary reference line extending along an edge of the first pattern extending in the first direction and a second imaginary reference line extending along an edge of the second pattern extending in the second direction.

The barcode pattern may be formed by irradiating a laser beam onto the second cover layer in the forming of the barcode pattern.

The method may further include manufacturing the circuit board before the providing of the circuit board. The manufacturing of the circuit board includes forming the alignment pattern on the base layer, forming a first preliminary cover layer on the base layer to cover the alignment pattern, forming a second preliminary cover layer on the first preliminary cover layer, and forming the first opening and the second opening through the first preliminary cover layer and the second preliminary cover layer, to form the first cover layer and the second cover layer, respectively.

According to the above, the display device includes the alignment pattern that provides the reference point to form the barcode pattern. As the alignment pattern with a reduced defect rate is provided, a defect rate of the barcode pattern, which is formed based on the alignment pattern, is also reduced. Accordingly, a reliability of the display device is improved, and a reliability of a manufacturing method of the display device is improved.

BRIEF DESCRIPTION OF THE DRAWINGS

The above and other advantages of the present disclosure will become readily apparent by reference to the following detailed description when considered in conjunction with the accompanying drawings wherein:

FIGS. 10A to 10D are views showing processes of a method of manufacturing a display device according to an embodiment of the present disclosure.

DETAILED DESCRIPTION

Figure 1:
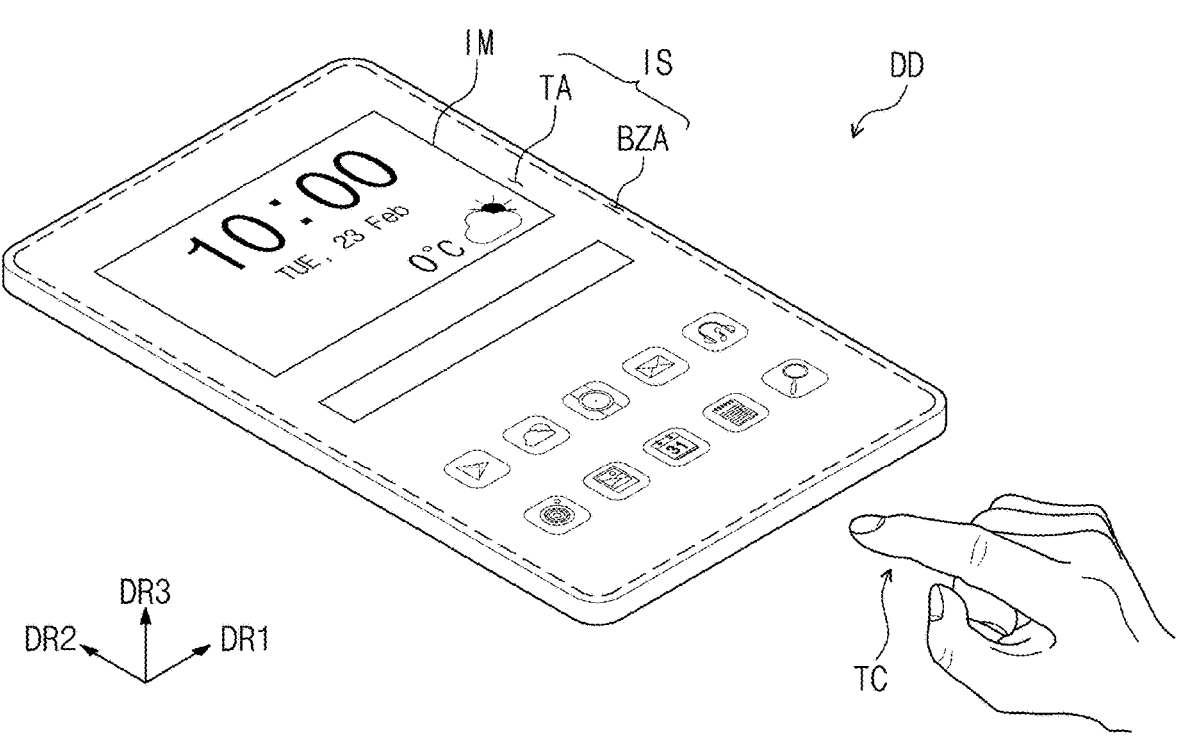
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value. Hereinafter, embodiments of the present disclosure will be described with reference to accompanying drawings.

FIG. 1 is a perspective view of a display device DD according to an embodiment of the present disclosure.

Referring to FIG. 1, the display device DD may have a rectangular shape with short sides extending in a first direction DR1 and long sides extending in a second direction DR2, however, the shape of the display device DD should not be limited thereto or thereby.

FIG. 1 shows a smartphone as the display device DD, however, it should not be limited thereto or thereby. For example, the display device DD may be applied to a large-sized display device, such as a television set or a monitor, and a small and medium-sized display device, such as a tablet computer, a car navigation unit, a game unit, and the like.

As shown in FIG. 1, the display device DD may display an image IM through a display surface IS, which is substantially parallel to each of the first direction DR1 and the second direction DR2, toward a third direction DR3. The display surface IS through which the image IM is displayed may correspond to a front surface of the display device DD. The image IM may include a video and a still image.

In the present embodiment, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3.

A separation distance in the third direction DR3 between the front surface and a rear surface of the display device DD may correspond to a thickness in the third direction DR3 of the display device DD. Meanwhile, directions indicated by the first, second, and third directions DR1, DR2, and DR3 are relative to each other, and thus, the directions indicated by the first, second, and third directions DR1, DR2, and DR3 may be changed to other directions.

The front surface of the display device DD may be divided into a transmission area TA and a bezel area BZA. The image IM may be displayed through the transmission area TA. The user may view the image IM through the transmission area TA. In the present embodiment, the transmission area TA may have a quadrangular shape with rounded vertices. However, this is merely an example, and the transmission area TA may have a variety of shapes and should not be particularly limited.

The bezel area BZA may be defined adjacent to the transmission area TA. The bezel area BZA may have a predetermined color. The bezel area BZA may surround the transmission area TA. Accordingly, the shape of the transmission area TA may be defined by the bezel area BZA, however, this is merely an example. According to an embodiment, the bezel area BZA may be disposed adjacent to only one side of the transmission area TA or may be omitted. The display device DD may be implemented in various embodiments, and it should not be particularly limited.

According to an embodiment, the display device DD may sense a user input TC applied thereto from the outside. The user input TC may include various types of external inputs, such as a part of a user's body, light, heat, or pressure. In the present embodiment, the user input TC is shown as a hand of the user applied to the front surface of the display device DD, however, this is merely an example. As described above, the user input TC may be provided in various forms. In addition, the display device DD may sense the user input TC applied to a side or rear surface of the display device DD depending on its structure, and it should not be limited to a specific embodiment.

The display device DD may activate the display surface IS to display the image IM and may sense the user input TC. According to an embodiment, an area where the user input TC is sensed may be defined in the transmission area TA through which the image IM is displayed, however, it should not be limited thereto or thereby. According to an embodiment, the area in which the user input TC is sensed may be defined in the bezel area BZA or may be defined in all areas of the display surface IS.

Figure 2A:
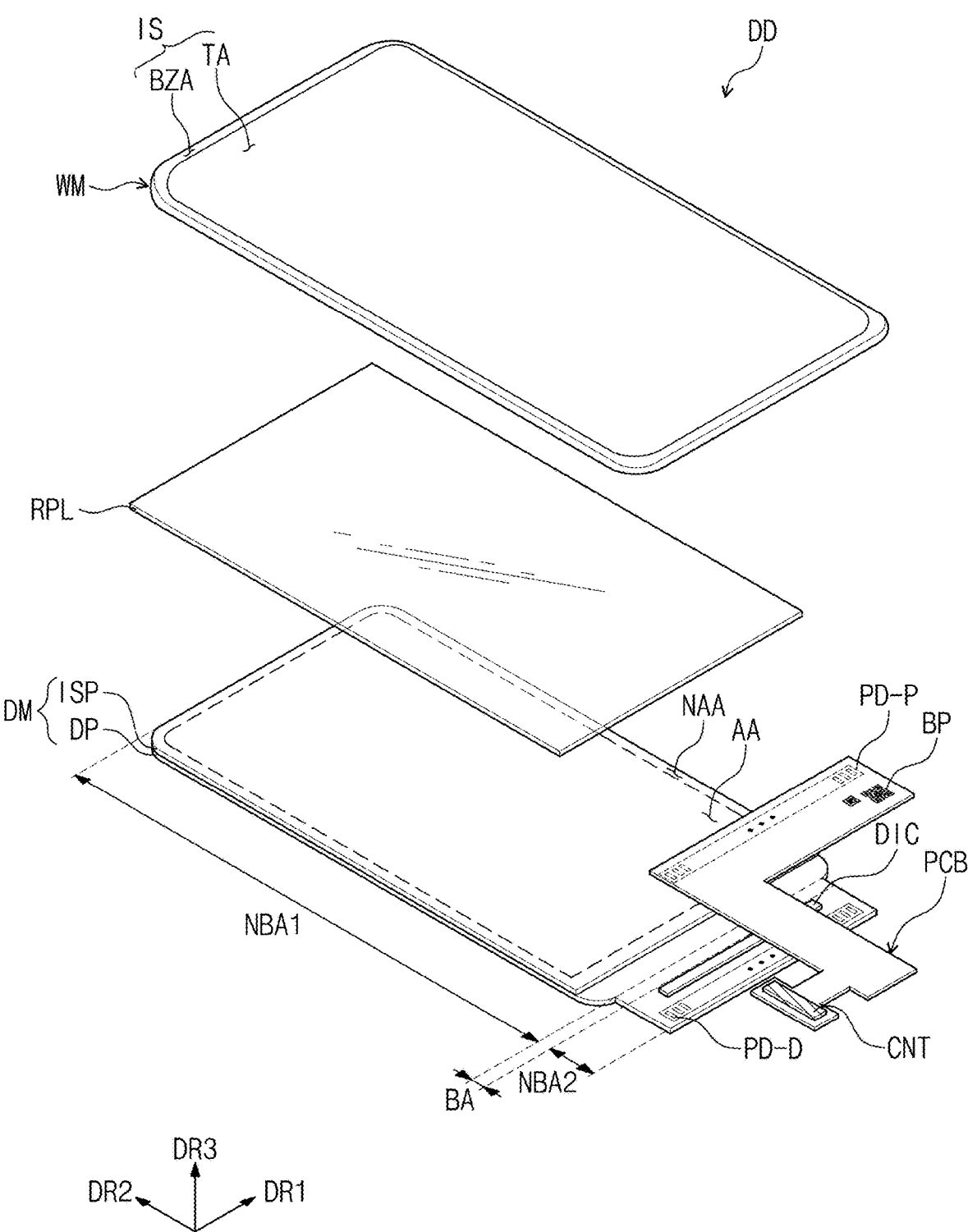
FIG. 2A is an exploded perspective view of a display device according to an embodiment of the present disclosure.
Figure 2B:
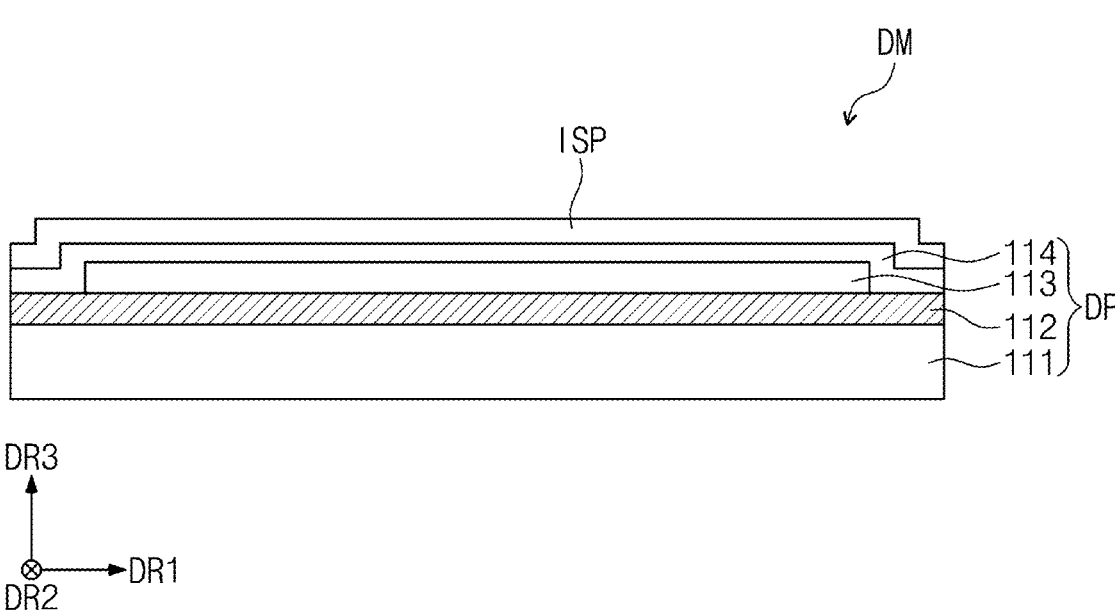
FIG. 2B is a cross-sectional view of a display module according to an embodiment of the present disclosure.

FIG. 2A is an exploded perspective view of the display device DD according to an embodiment of the present disclosure. FIG. 2B is a cross-sectional view of a display module DM according to an embodiment of the present disclosure.

Referring to FIGS. 2A and 2B, the display device DD may include a window WM, an anti-reflective layer RPL, a display module DM, and a circuit board PCB.

The window WM may include a transparent material through which an image transmits. For example, the window WM may include a glass, sapphire, or plastic material. The window WM is shown as a single layer, however, it should not be limited thereto or thereby. The window WM may include plural layers. Meanwhile, although not shown in figures, the bezel area BZA of the display device DD may be obtained by printing a material having the predetermined color on an area of the window WM.

One or more functional layers may be disposed between the display module DM and the window WM. As an example, the functional layer may be the anti-reflective layer RPL that prevents an external light from being reflected.

The anti-reflective layer RPL may prevent components of the display module DM from being viewed from the outside of the display device DD due to the external light incident into the display device DD through the front surface of the display device DD. The anti-reflective layer RPL may include a retarder and a polarizer. The retarder may be a film type or liquid crystal coating type and may include a 2/2 retarder and/or a 24 retarder. The polarizer may be a film type or liquid crystal coating type. The film type polarizer and the film type retarder may include a stretching type synthetic resin film, and the liquid crystal coating type polarizer and the liquid crystal coating type retarder may include liquid crystals aligned in a predetermined alignment. The retarder and the polarizer may be implemented as one polarizing film. The functional layer may further include a protective film disposed above or under the anti-reflective layer RPL.

An adhesive film may be further disposed between the display module DM and the anti-reflective layer RPL. The adhesive film may include an optically clear adhesive ("OCA") film, an optically clear resin ("OCR"), or a pressure sensitive adhesive ("PSA") film.

The display module DM may include an input sensor ISP and a display panel DP disposed under the input sensor ISP. The display panel DP may generate the image, and the input sensor ISP may obtain coordinate information of the user input (e.g., a touch event).

The display module DM may include an active area AA and a peripheral area NAA, which are defined therein. The active area AA may be an area from which the image provided from the display module DM is emitted. The peripheral area NAA may be defined adjacent to the active area AA. As an example, the peripheral area NAA may surround the active area AA, however, this is merely an example. The peripheral area NAA may have a variety of shapes and should not be particularly limited. According to an embodiment, the active area AA of the display module DM may correspond to at least a portion of the transmission area TA.

According to the present embodiment, the display panel DP may include a first non-bending area NBA1, a bending area BA, and a second non-bending area NBA2, which are sequentially arranged in a direction opposite to the second direction DR2. The bending area BA may be defined as a portion that is bent with respect to a predetermined axis extending in the first direction DR1. As the bending area BA is bent, the second non-bending area NBA2 may be disposed under the first non-bending area NBA1.

The first non-bending area NBA1 of the display panel DP may include the active area AA including a pixel. An area of the first non-bending area NBA1 except the active area AA, the bending area BA, and the second non-bending area NBA2 may correspond to the peripheral area NAA.

The second non-bending area NBA2 of the display panel DP may include a driving element DIC mounted therein. The second non-bending area NBA2 of the display panel DP may include a display pad part PD-D disposed adjacent to an end thereof. The circuit board PCB may be disposed at the end of the second non-bending area NBA2 of the display panel DP.

The circuit board PCB may include a substrate pad part PD-P disposed adjacent to an end thereof. The substrate pad part PD-P may be connected to the display pad part PD-D. Accordingly, the circuit board PCB may be electrically connected to the display module DM.

The circuit board PCB may transmit a signal to control the image IM (refer to FIG. 1) or a power signal to the display panel DP from a main board (not shown) of the display device DD. The circuit board PCB may be a flexible circuit board.

The display device DD may further include a functional layer disposed under the display module DM. The functional layer may be a metal layer or a cushion layer. The metal layer may support the display module DM. The cushion layer may include a polymer material and may absorb external impacts applied thereto. In addition, the functional layer may further include an adhesive layer.

Referring to FIG. 2B, the display module DM may include the display panel DP and the input sensor ISP disposed on the display panel DP.

The display panel DP may have a configuration that substantially generates the image. The display panel DP may be a light-emitting type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP. The display panel DP may be a flexible display panel. Accordingly, the display panel DP may be entirely rolled or may be folded.

The display panel DP may include a base layer 111, a circuit layer 112, a light emitting element layer 113, and an encapsulation layer 114.

The base layer 111 may include a synthetic resin layer. The base layer 111 may have a multi-layer structure. For instance, the base layer 111 may have a three-layer structure of a synthetic resin layer, an adhesive layer, and a synthetic resin layer. In particular, the synthetic resin layer may be a polyimide-based resin layer, however, a material for the synthetic resin layer should not be particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer 111 may include a glass substrate, or an organic/inorganic composite material substrate.

The circuit layer 112 may be disposed on the base layer 111. The circuit layer 112 may include an insulating layer, a semiconductor pattern, a conductive pattern, and a signal line. An insulating layer, a semiconductor layer, and a conductive layer may be formed on the base layer 111 by a coating or depositing process. Then, the insulating layer, the semiconductor layer, and the conductive layer may be selectively patterned through several photolithography processes. The semiconductor pattern, the conductive pattern, and the signal line included in the circuit layer 112 may be formed.

The light emitting element layer 113 may be disposed on the circuit layer 112. The light emitting element layer 113 may include a light emitting element. As an example, the light emitting element layer 113 may include an organic light emitting material, a quantum dot, a quantum rod, or a micro-LED.

The encapsulation layer 114 may be disposed on the light emitting element layer 113. The encapsulation layer 114 may include an inorganic layer, an organic layer, and an inorganic layer, which are sequentially stacked, however, the layers of the encapsulation layer 114 should not be limited thereto or thereby.

The inorganic layers may protect the light emitting element layer 113 from moisture and oxygen, and the organic layer may protect the light emitting element layer 113 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer, however, it should not be limited thereto or thereby.

The input sensor ISP may be disposed on the display panel DP. The input sensor ISP may be disposed directly on the display panel DP. As an example, the input sensor ISP may be formed on the display panel DP through successive processes. In the present disclosure, the expression "the input sensor ISP is disposed directly on the display panel DP" means that no intervening elements are present between the input sensor ISP and the display panel DP.

However, the present disclosure should not be limited thereto or thereby. As an example, an adhesive film may be disposed between the input sensor ISP and the display panel DP. In this case, the input sensor ISP may not be manufactured through successive processes with the display panel DP and may be attached to an upper surface of the display panel DP by the adhesive film after being manufactured separately from the display panel DP.

The input sensor ISP may sense the external input applied thereto from the outside. The external input may be the user input. The user input may include various forms of inputs, such as a part of user's body, light, heat, pen, or pressure.

Figure 3A:
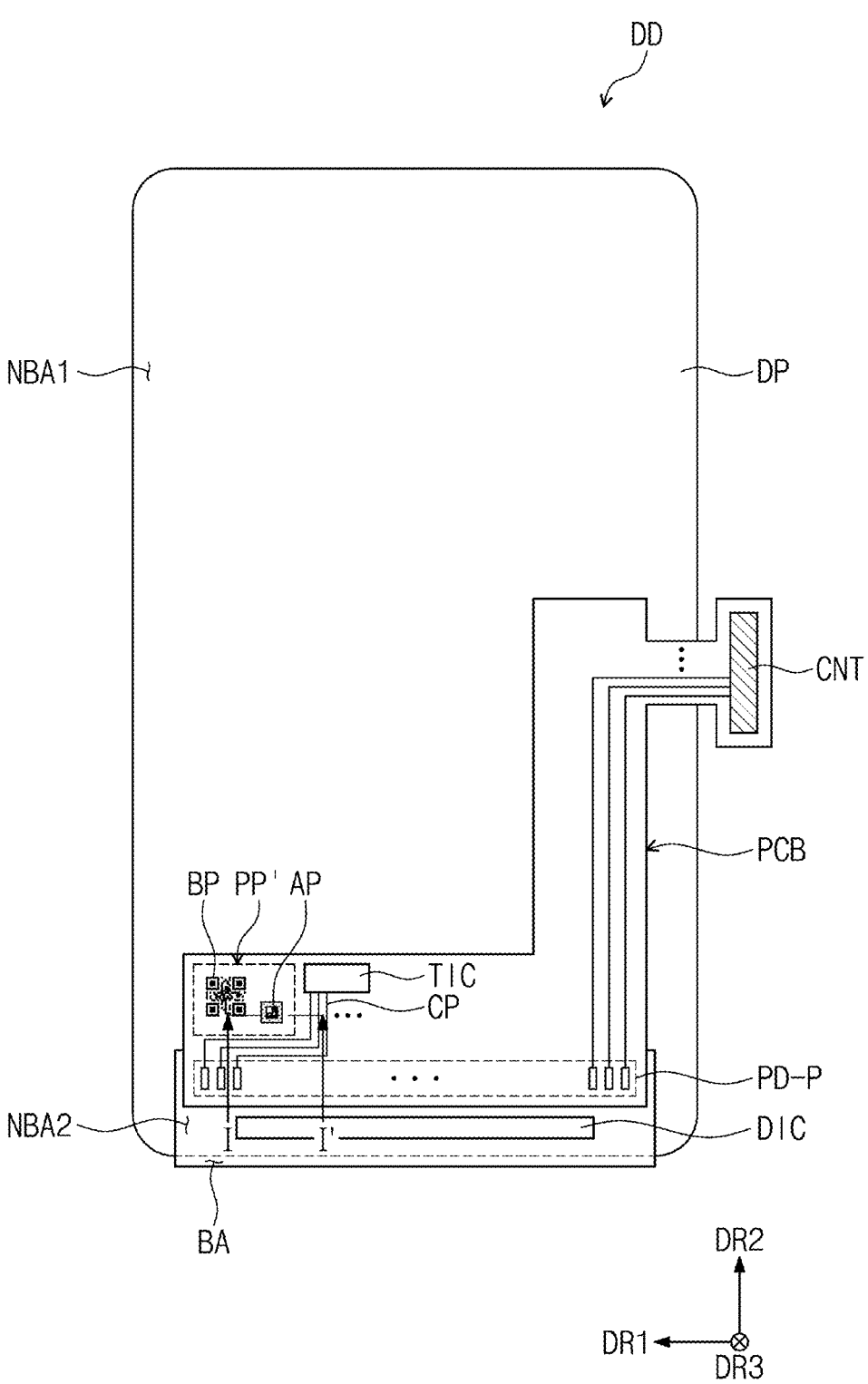
FIG. 3A is a plan view of a display device according to an embodiment of the present disclosure.
Figure 3B:
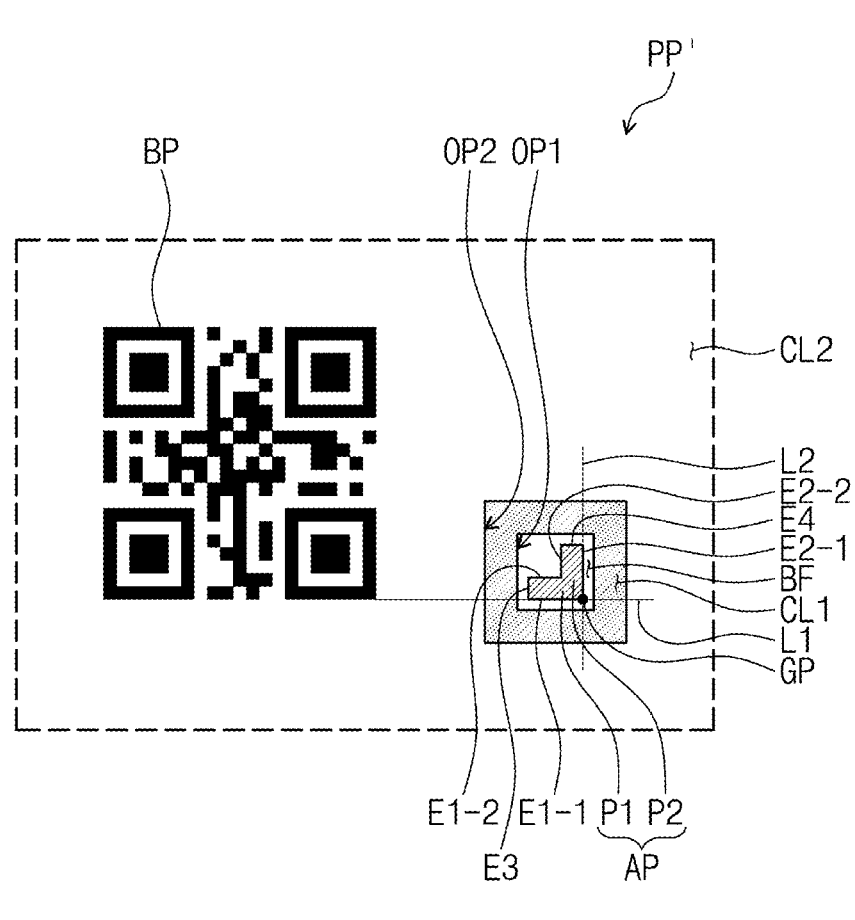
FIG. 3B is an enlarged plan view of an area PP' of FIG. 3A.
Figure 3B:
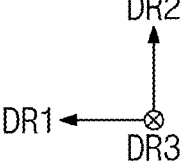
Figure 3C:
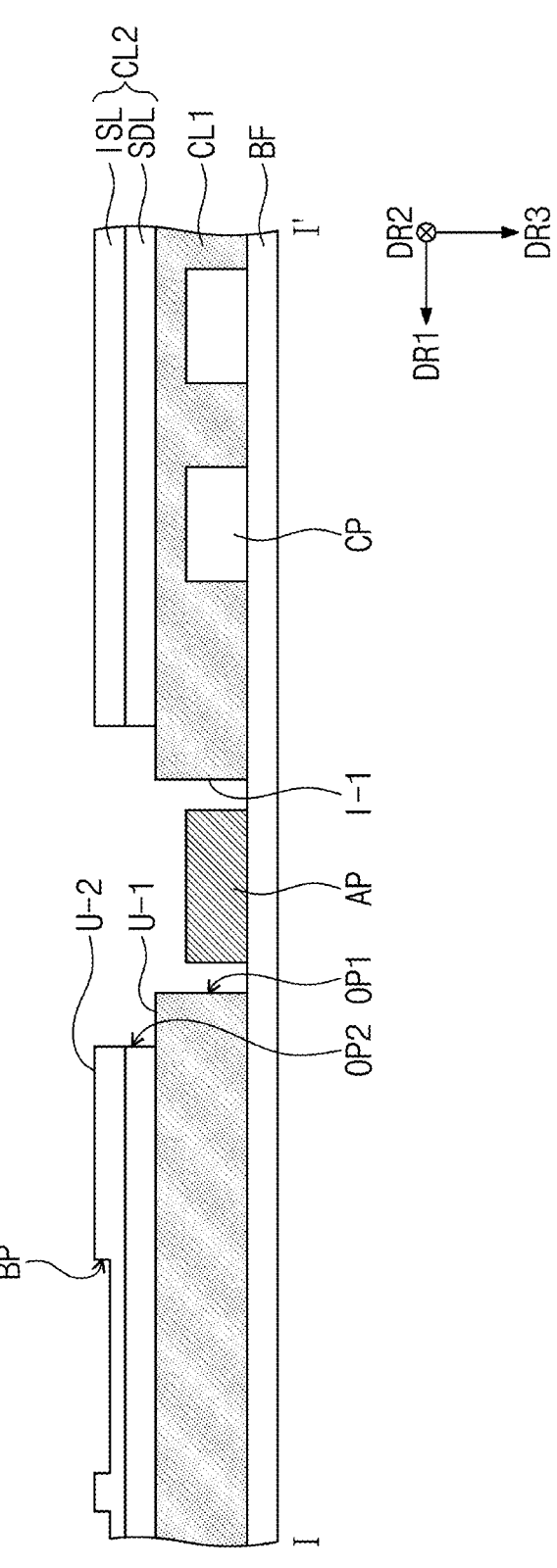
FIG. 3C is a cross-sectional view taken along line I-I' of FIG. 3A.

FIG. 3A is a plan view of the display device DD according to an embodiment of the present disclosure. FIG. 3B is an enlarged plan view of an area PP' of FIG. 3A, and FIG. 3C is a cross-sectional view taken along line I-I' of FIG. 3A. FIG. 3A is a plan view of a rear surface of the display panel DP when the display device DD is bent. As described with reference to FIG. 2A, the bending area BA of the display panel DP may be bent, and thus, the second non-bending area NBA2 of the display panel DP and the circuit board PCB may face the rear surface of the first non-bending area NBA1 of the display panel DP. As used herein, the plan view is a view in a third direction DR3.

Referring to FIGS. 3A to 3C, the circuit board PCB may include a base layer BF, a plurality of elements, a connector CNT, a circuit pattern CP, an alignment pattern AP, a first cover layer CL1, and a second cover layer CL2.

The base layer BF may include an insulating material. As an example, the base layer BF may include an organic insulating material. In an embodiment, the base layer BF may include a polymer material, such as polyimide ("PI"), polyethylene terephthalate ("PET"), polyethylene naphthalate ("PEN"), or the like.

The elements may be disposed on the base layer BF. The elements may include a timing controller TIC, a voltage generator, a resistor, a condenser, an inductor, and a plurality of terminals.

The connector CNT may be disposed on the base layer BF. The connector CNT may be a connection member to electrically connect circuit boards to each other. Accordingly, the circuit board PCB may be connected to the main board via the connector CNT, and the circuit board PCB may electrically connect the display module DM and the main board to each other. The connector CNT may be disposed on the base layer BF in area that does not overlap the display panel DP in a plan view, however, a position of the connector CNT should not be limited thereto or thereby.

The circuit pattern CP may be disposed on the base layer BF. The circuit pattern CP may be signal lines. Some of the signal lines may extend from the substrate pad part PD-P to the elements to electrically connect the substrate pad part PD-P to the elements or may be disposed between the elements to electrically connect the elements disposed at opposite ends of each of the signal lines, respectively. In addition, some of the signal lines may extend from the substrate pad part PD-P to the connector CNT to electrically connect the substrate pad part PD-P to the connector CNT.

FIG. 3A shows the signal lines extending from the substrate pad part PD-P and connected to the timing controller TIC and the signal lines extending from the substrate pad part PD-P and connected to the connector CNT as a representative example of the circuit pattern CP.

According to an embodiment, the circuit pattern CP may include a conductive material. The circuit pattern CP may include a metal material, for example, copper.

The alignment pattern AP may be disposed on the base layer BF. The alignment pattern AP may be spaced apart from the circuit pattern CP in a plan view.

According to an embodiment, the alignment pattern AP may include the same material as the circuit pattern CP. The alignment pattern AP may include a metal material, for example, copper. In addition, according to an embodiment, the alignment pattern AP may be formed through the same process as the circuit pattern CP.

According to the present embodiment, as shown in FIG. 3B, the alignment pattern AP may include a first portion P1 extending in the first direction DR1 and a second portion P2 extending from the first portion P1 to the second direction DR2. In the present disclosure, the first portion P1 and the second portion P2 may be defined by dividing an area of the alignment pattern AP for the convenience of description and may substantially form one pattern.

The first portion P1 may include first sides E1-1 and E1-2 extending in the first direction DR1 and spaced apart from each other in the second direction DR2 and a first connection side E3 connecting ends of the first sides E1-1 and E1-2 spaced apart from the second portion P2 and extending in the second direction DR2.

The second portion P2 may include second sides E2-1 and E2-2 extending in the second direction DR2 and spaced apart from each other in the first direction DR1 and a second connection side E4 connecting ends of the second sides E2-1 and E2-2 spaced apart from the first portion P1 and extending in the first direction DR1.

In the present embodiment, among the first sides E1-1 and E1-2 and the second sides E2-1 and E2-2, the first side and the second side, which are connected to each other, (e.g., the first side E1-1 and the second side E2-1 are connected to each other, the first side E1-2 and the second side E2-2 are connected to each other) may be perpendicular to each other. As shown in FIG. 3B, the alignment pattern AP may have a horizontally flipped L shape when viewed in a plane (e.g., in a plan view). However, it should not be limited thereto or thereby. According to another embodiment, the alignment pattern AP may have the L shape, may have a vertically flipped L shape, or may have a shape obtained by rotating the L shape by 180 degrees in a plan view. In addition, the shape of the alignment pattern AP should not be limited to any one polygonal shape as long as it includes sides orthogonal to each other when viewed in the plane. This will be described in detail later.

In the present disclosure, the alignment pattern AP may provide information on a location where the barcode pattern BP is to be formed when the barcode pattern BP is formed. As an example, the alignment pattern AP may provide a reference point GP with respect to the location where the barcode pattern BP is to be formed.

According to the present disclosure, the alignment pattern AP may have a brightness different from a brightness of the base layer BF. As a difference in brightness between the alignment pattern AP and the base layer BF increases, an accuracy of the reference point GP recognized from the alignment pattern AP may increase, and accordingly, the barcode pattern BP may be formed at a more accurate location.

According to the present embodiment, in a case where the alignment pattern AP has a polygonal shape, the reference point GP may be defined as an intersection of a first reference line L1 and a second reference line L2. The first reference line L1 may be defined as an imaginary line extending in the first direction DR1 along one of the first sides E1-1 and E1-2. The second reference line L2 may be defined as an imaginary line extending in the second direction DR2 along one of the second sides E2-1 and E2-2.

FIG. 3B shows a structure in which the first reference line L1 extends along the first side E1-1 that is relatively long between the first sides E1-1 and E1-2 as a representative example, however, the first reference line L1 may extend along the first side E1-2 that is relatively short between the first sides E1-1 and E1-2 in another embodiment. FIG. 3B shows a structure in which the second reference line L2 extends along the second side E2-1 that is relatively long between the second sides E2-1 and E2-2 as a representative example, however, the second reference line L2 may extend along the second side E2-2 that is relatively short between the second sides E2-1 and E2-2 in another embodiment.

According to an embodiment, each of a maximum length in the first direction DR1 of the alignment pattern AP and a maximum length in the second direction DR2 of the alignment pattern AP may be equal to or greater than about 0.2 mm and equal to or smaller than about 2.0 mm.

The first cover layer CL1 may be disposed on the base layer BF. The first cover layer CL1 may cover the circuit pattern CP. The first cover layer CL1 may be provided with a first opening OP1 defined therethrough. The first opening OP1 may be formed penetrating through the first cover layer CL1 from an upper surface U-1 to a lower surface of the first cover layer CL1. The alignment pattern AP may be exposed through the first opening OP1.

According to an embodiment, an inner side surface I-1 of the first cover layer CL1, which defines the first opening OP1, may surround the alignment pattern AP. The inner side surface I-1 of the first cover layer CL1 may be disposed spaced apart from the alignment pattern AP in a plan view. A portion of the base layer BF may be exposed through the first opening OP1 without being covered by the first cover layer CL1.

According to an embodiment, the first opening OP1 may have a quadrangular shape when viewed in the plane (e.g., in a plan view). However, the shape of the first opening OP1 should not be particularly limited as long as the inner side surface I-1 surrounds the alignment pattern AP.

According to an embodiment, the first cover layer CL1 may include an insulating material. As an example, the first cover layer CL1 may include an organic insulating material, and the organic insulating material may include a polymer material, such as polyimide (PI), polyethylene terephthalate (PET), polyethylene naphthalate (PEN), and the like.

The second cover layer CL2 may be disposed on the first cover layer CL1. According to the present embodiment, the second cover layer CL2 may include a shielding layer SDL and an insulating layer ISL.

The shielding layer SDL may be disposed on the first cover layer CL1. The shielding layer SDL may include a conductive material. As an example, the shielding layer SDL may include a metal material. The shielding layer SDL may include a binder and metal particles dispersed in the binder. The metal particles may be silver particles.

The shielding layer SDL may be connected to a ground electrode. Accordingly, the shielding layer SDL may shield an external static electricity and thus may prevent damage to the elements and the circuit pattern CP.

The insulating layer ISL may be disposed on the shielding layer SDL. The insulating layer ISL may include an insulating material. As an example, the insulating layer ISL may include an organic insulating material, and the organic insulating material may include a polymer material, such as polyimide (PI), polyethylene terephthalate (PET), or polyethylene naphthalate (PEN).

According to the present disclosure, the barcode pattern BP may be formed in the insulating layer ISL. The barcode pattern BP may include predetermined information on elements mounted on the display panel DP or the circuit board PCB. As an example, the predetermined information may include information about products, such as a name of the product and a manufacturer of the product.

The barcode pattern BP may be a one-dimensional barcode or a two-dimensional barcode. The one-dimensional barcode may include EAN code, CODE39 code, INTERLEAVED 2 OF 5 code, etc. The two-dimensional barcode may include QR code, PDF417code, MaxiCode, and CODEONE code. FIGS. 3A and 3B show QR code as a representative example of the barcode pattern BP.

FIG. 3A shows the barcode pattern BP disposed at a left upper end of the circuit board PCB, however, the location of the barcode pattern BP should not be particularly limited.

The barcode pattern BP may be formed by a laser process. As an example, the barcode pattern BP may be formed by irradiating a laser beam onto an upper surface U-2 of the insulating layer ISL disposed at an uppermost position of the second cover layer CL2. According to an embodiment, the barcode pattern BP may correspond to a pattern formed by removing at least a portion of the insulating layer ISL along a thickness direction (i.e., third direction DR3) of the insulating layer ISL using the laser beam. The barcode pattern BP may correspond to a discolored portion of the insulating layer ISL, which is heated by the laser beam and carbonized.

According to the present disclosure, the location where the barcode pattern BP is to be formed may be set as coordinates of a location spaced apart from the reference point GP in a plan view. A carving device CD (refer to FIG. 9F) may be aligned based on the reference point recognized from the alignment pattern AP by a detection device such as a vision camera VC (refer to FIG. 9D) and may form the barcode pattern BP at predetermined coordinates.

According to the present embodiment, the barcode pattern BP and the alignment pattern AP may be disposed spaced apart from each other in the first direction DR1 in which the first reference line L1 extends. At least a portion of the alignment pattern AP may overlap the barcode pattern BP in the first direction DR1, however, it should not be limited thereto or thereby. According to another embodiment, the barcode pattern BP and the alignment pattern AP may be disposed spaced apart from each other in the second direction DR2 in which the second reference line L2 extends, and at least a portion of the alignment pattern AP may overlap the barcode pattern BP in the second direction DR2.

According to an embodiment, a minimum separation distance between the barcode pattern BP and the alignment pattern AP may be equal to or greater than about 1.0 millimeter (mm). When the minimum separation distance between the barcode pattern BP and the alignment pattern AP is smaller than about 1.0 mm, it may be difficult to recognize the reference point GP and the coordinates of the location spaced apart from the reference point GP separately, and a reliability with respect to the location of the barcode pattern BP may decrease.

The second cover layer CL2 may be provided with a second opening OP2 defined therethrough. The second opening OP2 may overlap the first opening OP1 in a plan view. The second opening OP2 may be formed penetrating through the second cover layer CL2 from the upper surface U-2 of the insulating layer ISL to a lower surface of the shielding layer SDL.

The second opening OP2 may overlap the whole of the first opening OP1. When viewed in the plane (i.e., in a plan view), the second opening OP2 may have a size greater than a size of the first opening OP1. Accordingly, a portion of the upper surface U-1 of the first cover layer CL1 may be exposed through the second opening OP2. The upper surface U-1 of the first cover layer CL1 exposed through the second opening OP2 may surround the alignment pattern AP when viewed in the plane.

According to an embodiment, the second opening OP2 may have a quadrangular shape when viewed in the plane, however, the shape of the second opening OP2 should not be particularly limited.

FIG. 3C shows the structure in which the circuit pattern CP is disposed only on the base layer BF, however, the present disclosure should not be limited thereto or thereby. According to an embodiment, the circuit pattern CP may be disposed under the base layer BF. Accordingly, at least one of the first cover layer CL1 and the second cover layer CL2 may be disposed not only on the base layer BF but also under the base layer BF.

Figure 4A:
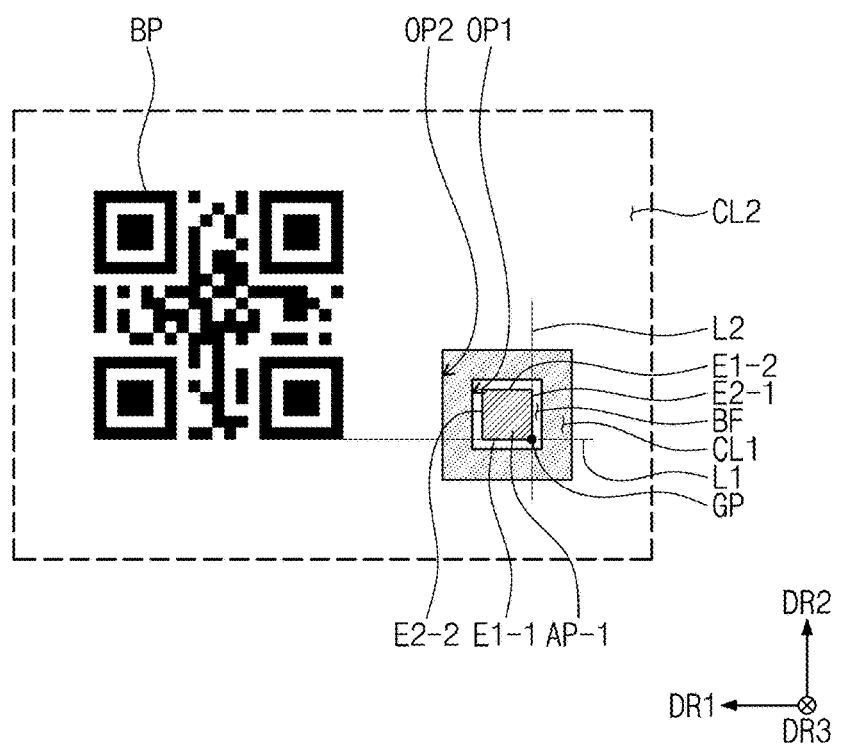
FIGS. 4A and 4B are enlarged plan views of some components of display devices according to embodiments of the present disclosure.
Figure 4B:
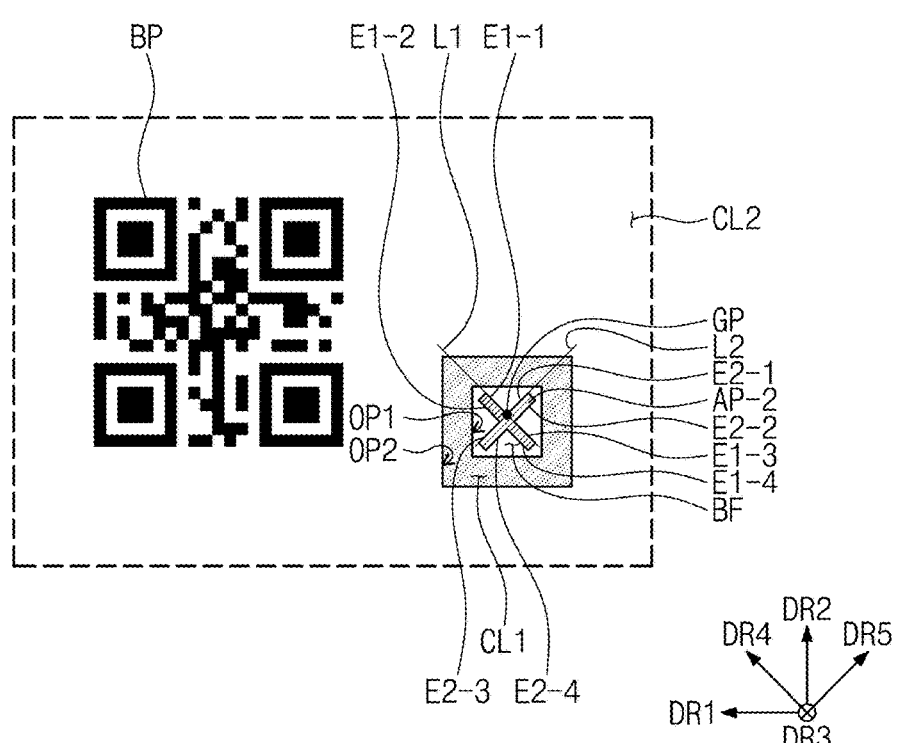
Figure 5A:
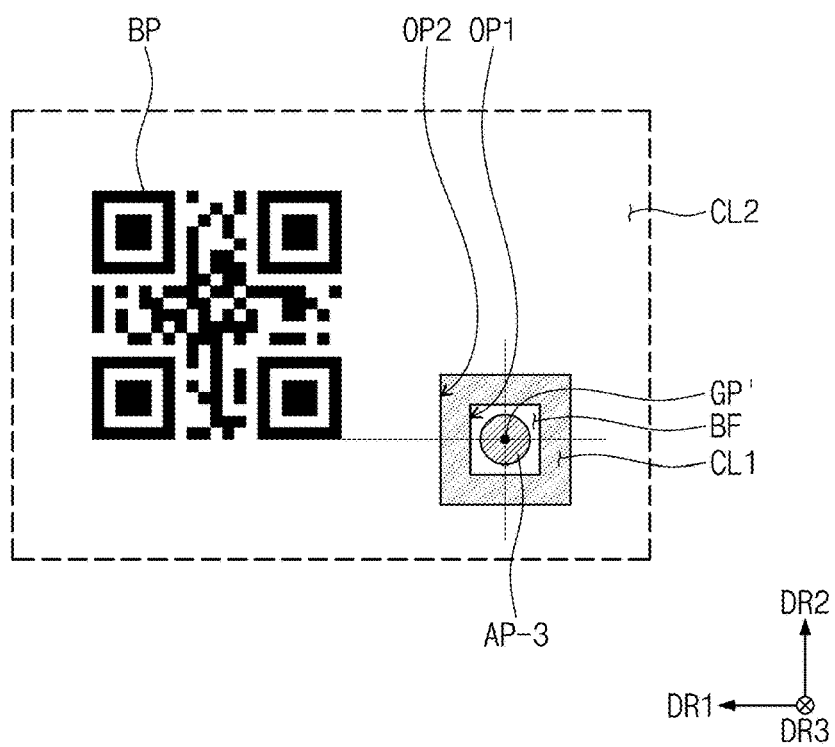
FIGS. 5A and 5B are enlarged plan views of some components of display devices according to embodiments of the present disclosure.
Figure 5B:
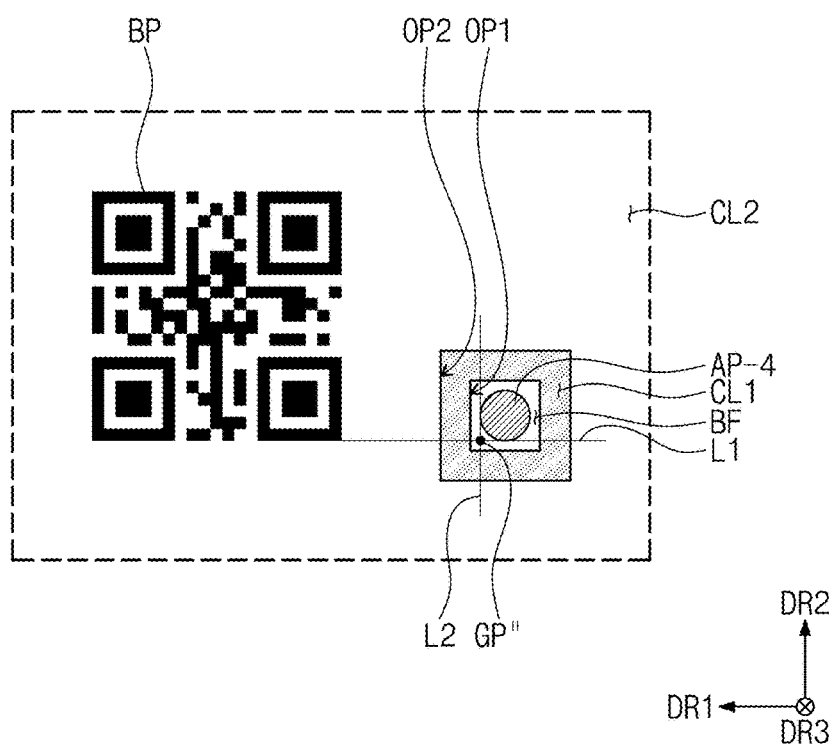

FIGS. 4A and 4B are enlarged plan views of some components of display devices DD according to embodiments of the present disclosure. FIGS. 5A and 5B are enlarged plan views of some components of display devices DD according to embodiments of the present disclosure.

FIGS. 4A to 5B are enlarged plan views of an area corresponding to the area PP' shown in FIG. 3A.

FIGS. 4A to 5B show various shapes of alignment patterns AP-1, AP-2, AP-3, and AP-4. In the embodiments shown in FIGS. 4A to 5B, a barcode pattern BP and the reference points GP, GP' and GP" may be disposed spaced apart from each other in the first direction DR1, and at least a portion of the alignment patterns AP-1, AP-2, AP-3, and AP-4 may overlap the barcode pattern BP in the first direction DR1.

However, the present disclosure should not be limited thereto or thereby. According to an embodiment, the barcode pattern BP and reference points GP, GP' and GP" may be disposed spaced apart from each other in the second direction DR2, and at least a portion of the alignment patterns AP-1, AP-2, AP-3, and AP-4 may overlap the barcode pattern BP in the second direction DR2. In FIGS. 4A to 5B, the same reference numerals denote the same elements in FIGS. 1 to 3C, and thus, detailed descriptions of the same elements will be omitted.

Referring to FIG. 4A, the alignment pattern AP-1 may have a quadrangular shape. The alignment pattern AP-1 may include first sides E1-1 and E1-2 extending in the first direction DR1 and second sides E2-1 and E2-2 extending in the second direction DR2.

According to an embodiment, each of the first sides E1-1 and E1-2 and each of the second sides E2-1 and E2-2 may have a length equal to or greater than about 0.2 mm and equal to or smaller than about 2.0 mm. FIG. 4A shows the alignment pattern AP-1 having a square shape in which the first sides E1-1 and E1-2 and the second sides E2-1 and E2-2 have the same length as each other as a representative example, however, it should not be limited thereto or thereby. According to an embodiment, the alignment pattern AP-1 may have a rectangular shape.

A reference point GP provided by the alignment pattern AP-1 may be defined as an intersection of a first reference line L1 and a second reference line L2. The first reference line L1 may be an imaginary line extending in the first direction DR1 along one of the first sides E1-1 and E1-2, and the second reference line L2 may be an imaginary line extending in the second direction DR2 along one of the second sides E2-1 and E2-2. Accordingly, the reference point GP may be defined as one of four vertices of the alignment pattern AP-1.

A first opening OP1 may have a quadrangular shape when viewed in the plane. As an example, the first opening OP1 may be defined by sides extending in the first direction DR1 and the second direction DR2 in the plane, and the quadrangular shape of the alignment pattern AP-1 may be surrounded by the first opening OP1.

A second opening OP2 may have a quadrangular shape when viewed in the plane. As an example, the second opening OP2 may be defined by sides extending in the first direction DR1 and the second direction DR2 in the plane, and the quadrangular shape of the first opening OP1 may be surrounded by the second opening OP2.

However, the shape of the first opening OP1 and the shape of the second opening OP2 should not be limited thereto or thereby. According to an embodiment, at least one of the first opening OP1 and the second opening OP2 may have a circular shape or a polygonal shape rather than the quadrangular shape.

Referring to FIG. 4B, the alignment pattern AP-2 may have an X shape. The alignment pattern AP-2 may include a portion extending in a fourth direction DR4 corresponding to an oblique direction of the first direction DR1 and the second direction DR2 and a portion extending in a fifth direction DR5 perpendicular to the fourth direction DR4. Accordingly, the alignment pattern AP-2 may include a first group of first sides E1-1 and E1-2, which extend in the fourth direction DR4 and are spaced apart from each other in the fifth direction DR5, a second group of first sides E1-3 and E1-4, which extend in the fourth direction DR4 and are spaced apart from each other in the fifth direction DR5, a first group of second sides E2-1 and E2-2, which extend in the fifth direction DR5 and are spaced apart from each other in the fourth direction DR4, and a second group of second sides E2-3 and E2-4 which extend in the fifth direction DR5 and are spaced apart from each other in the fourth direction DR4.

According to an embodiment, a maximum length in the fourth direction DR4 of the alignment pattern AP-2 and a maximum length in the fifth direction DR5 of the alignment pattern AP-2 may be equal to or greater than about 0.2 mm and equal to or smaller than about 2.0 mm.

A reference point GP provided by the alignment pattern AP-2 may be defined as an intersection of a first reference line L1 and a second reference line L2. The first reference line L1 may be an imaginary line extending in the fourth direction DR4 along one of the first sides E1-1, E1-2, E1-3, and E1-4 of the first and second groups. The second reference line L2 may be an imaginary line extending in the fifth direction DR5 along one of the second sides E2-1, E2-2, E2-3, and E2-4 of the first and second groups. Accordingly, the reference point GP may be defined as one of four vertices where the first sides E1-1, E1-2, E1-3, and E1-4 are respectively connected to the second sides E2-1, E2-2, E2-3, and E2-4 of the alignment pattern AP-2.

Each of a first opening OP1 and a second opening OP2 may have a quadrangular shape when viewed in the plane, however, it should not be limited thereto or thereby. At least one of the first opening OP1 and the second opening OP2 may have a circular shape or a polygonal shape rather than the quadrangular shape. As an example, at least one of the first opening OP1 and the second opening OP2 may have the X shape corresponding to the shape of the alignment pattern AP-2.

Referring to FIGS. 5A and 5B, the alignment patterns AP-3 and AP-4 may have a circular shape.

According to an embodiment, each of a diameter in the first direction DR1 of the alignment patterns AP-3 and AP-4 and a diameter in the second direction DR2 of the alignment patterns AP-3 and AP-4 may be equal to or greater than about 0.2 mm and equal to or smaller than about 2.0 mm. FIGS. 5A and 5B show the alignment patterns AP-3 and AP-4 each having the circular shape with the same diameter in the first direction DR1 and the second direction DR2 as a representative example, however, they should not be limited thereto or thereby. According to an embodiment, each of the alignment patterns AP-3 and AP-4 may have an oval shape.

As shown in FIG. 5A, a reference point GP' provided by the alignment pattern AP-3 may be defined as a center of the alignment pattern AP-3.

As shown in FIG. 5B, a reference point GP" provided by the alignment pattern AP-4 may be defined as an intersection of a first reference line L1 and a second reference line L2. The first reference line L1 may be defined as a tangent line to the alignment pattern AP-4 extending in the first direction DR1, and the second reference line L2 may be defined as a tangent line to the alignment pattern AP-4 extending in the second direction DR2. That is, the reference point GP" may be defined as one of vertices of a quadrangular shape of which an inscribed circle is the alignment pattern AP-4.

Each of a first opening OP1 and a second opening OP2 may have a quadrangular shape when viewed in the plane, however, it should not be limited thereto or thereby. According to an embodiment, at least one of the first opening OP1 and the second opening OP2 may have a circular shape or a polygonal shape rather than the quadrangular shape.

Figure 6:
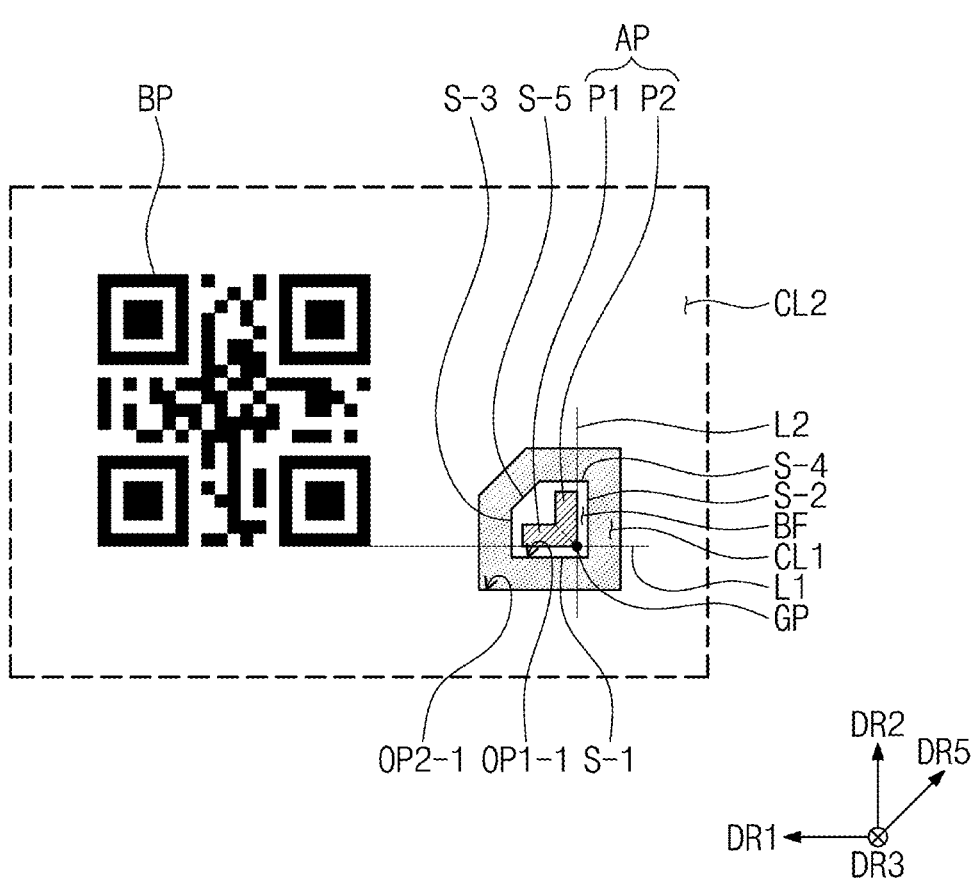
FIG. 6 is an enlarged plan view of some components of a display device according to an embodiment of the present disclosure.

FIG. 6 is an enlarged plan view of some components of a display device DD (refer to FIG. 1) according to an embodiment of the present disclosure. FIG. 6 is an enlarged plan view of an area corresponding to the area PP' shown in FIG. 3A. An alignment pattern AP according to the present embodiment may correspond to the alignment pattern AP described with reference to FIG. 3B and may include a first portion P1 extending in the first direction DR1 and a second portion P2 extending from one end of the first portion P1 to the second direction DR2. In FIG. 6, the same reference numerals denote the same elements in FIGS. 1 to 3C, and thus, detailed descriptions of the same elements will be omitted.

Referring to FIG. 6, different from FIG. 3B, a first opening OP1-1 may have a pentagon shape when viewed in the plane. The first opening OP1-1 may include a first opening side S-1 extending in the first direction DR1 and defined adjacent to a first side E1-1 (refer to FIG. 3B) that is relatively long among first sides E1-1 and E1-2 (refer to FIG. 3B) and a second opening side S-2 extending from one end of the first opening side S-1 to the second direction DR2 and defined adjacent to a second side E2-1 (refer to FIG. 3B) that is relatively long among second sides E2-1 and E2-2 (refer to FIG. 3B).

In addition, the first opening OP1-1 may include a third opening side S-3 extending from the other end of the first opening side S-1 to the second direction DR2, a fourth opening side S-4 extending from one end of the second opening side S-2 spaced apart from the first opening side S-1 to the first direction DR1, and a fifth opening side S-5 extending from one end of the third opening side S-3 to one end of the fourth opening side S-4 along the fifth direction DR5.

That is, the pentagon shape of the first opening OP1-1 may correspond to a shape obtained by removing a portion of one vertex along the fifth direction DR5 in a quadrangular shape including sides extending in the first direction DR1 and the second direction DR2. The portion of the one vertex may be a vertex most distant from a portion where the first and second portions P1 and P2 of the alignment pattern AP are connected to each other.

Different from FIG. 3B, a second opening OP2-1 may have a pentagon shape when viewed in the plane. The shape of the second opening OP2-1 may be similar to the pentagon shape of the first opening OP1-1.

According to the present embodiment, as the portion of the one vertex is removed, an area of the base layer BF exposed through the first opening OP1-1 may be reduced. Accordingly, an area in the circuit board PCB where the circuit pattern CP or the elements are disposed, may increase, and a degree of freedom in manufacturing the circuit board PCB may further increase.

Figure 7A:
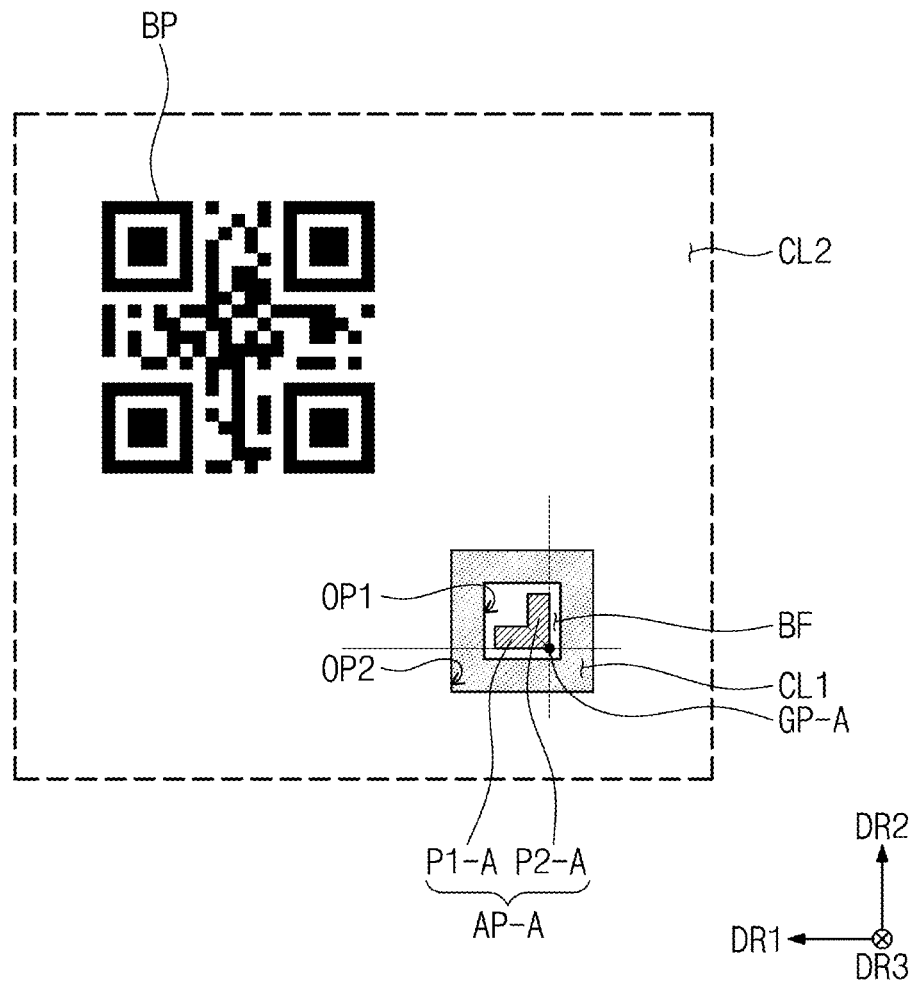
FIGS. 7A and 7B are enlarged plan views of some components of display devices according to embodiments of the present disclosure.
Figure 7B:
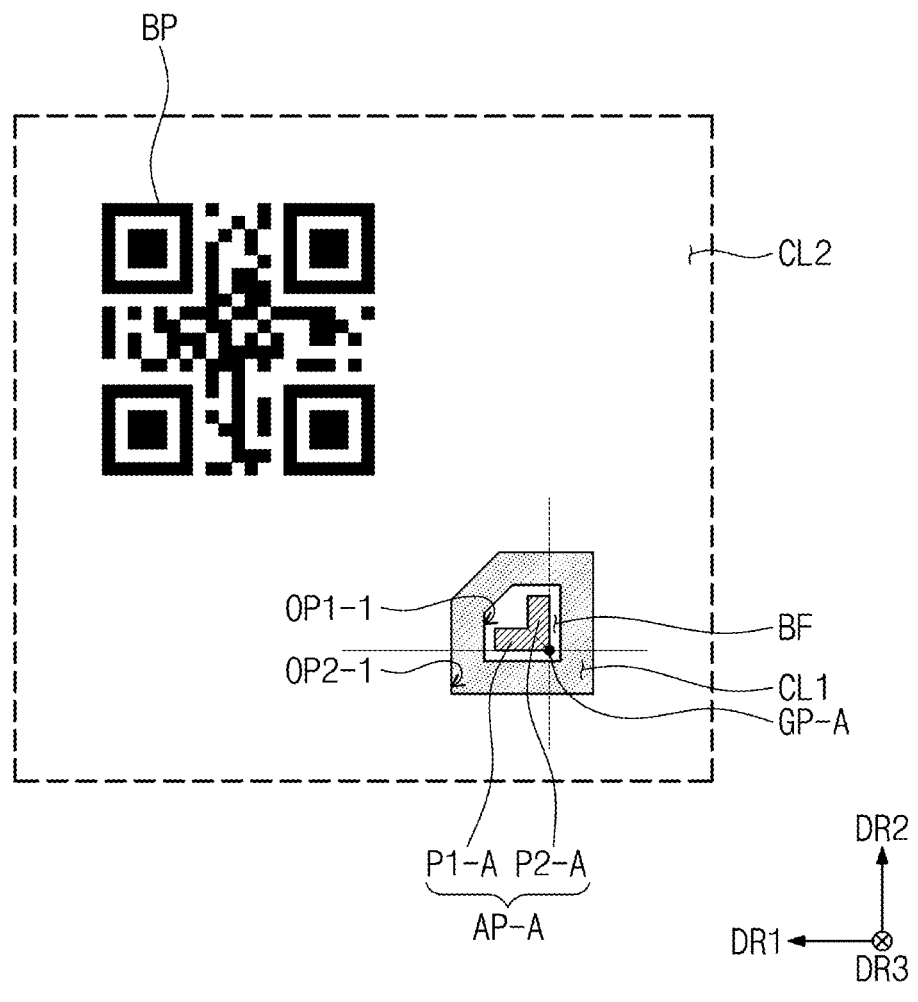

FIGS. 7A and 7B are enlarged plan views of some components of display devices DD (refer to FIG. 1) according to embodiments of the present disclosure. FIGS. 7A and 7B are enlarged plan views of an area corresponding to the area PP' shown in FIG. 3A. As shown in FIGS. 7A and 7B, an alignment pattern AP-A according to the present embodiment may include a first portion P1-A extending in the first direction DR1 and a second portion P2-A extending from one end of the first portion P1-A to the second direction DR2. In FIGS. 7A and 7B, the same reference numerals denote the same elements in FIGS. 1 to 6, and thus, detailed descriptions of the same elements will be omitted.

Referring to FIGS. 7A and 7B, the alignment pattern AP-A may not overlap a barcode pattern BP in the first direction DR1 and the second direction DR2. The alignment pattern AP-A and the barcode pattern BP may be disposed spaced apart from each other in an oblique direction of the first direction DR1 and the second direction DR2. In addition, a reference point GP-A defined by the alignment pattern AP-A may be spaced apart from the barcode pattern BP in the oblique direction of the first direction DR1 and the second direction DR2.

However, a shape of the alignment pattern AP-A should not be limited to a shape shown in FIGS. 7A and 7B and may be provided in various ways as described with reference to FIGS. 3A to 5B. In addition, shapes of first openings OP1 and OP1-1 and shapes of second openings OP2 and OP2-1 should not be limited to the shapes shown in FIGS. 7A and 7B and may be provided in various ways as described with reference to FIGS. 3A to 5B.

Figure 8:
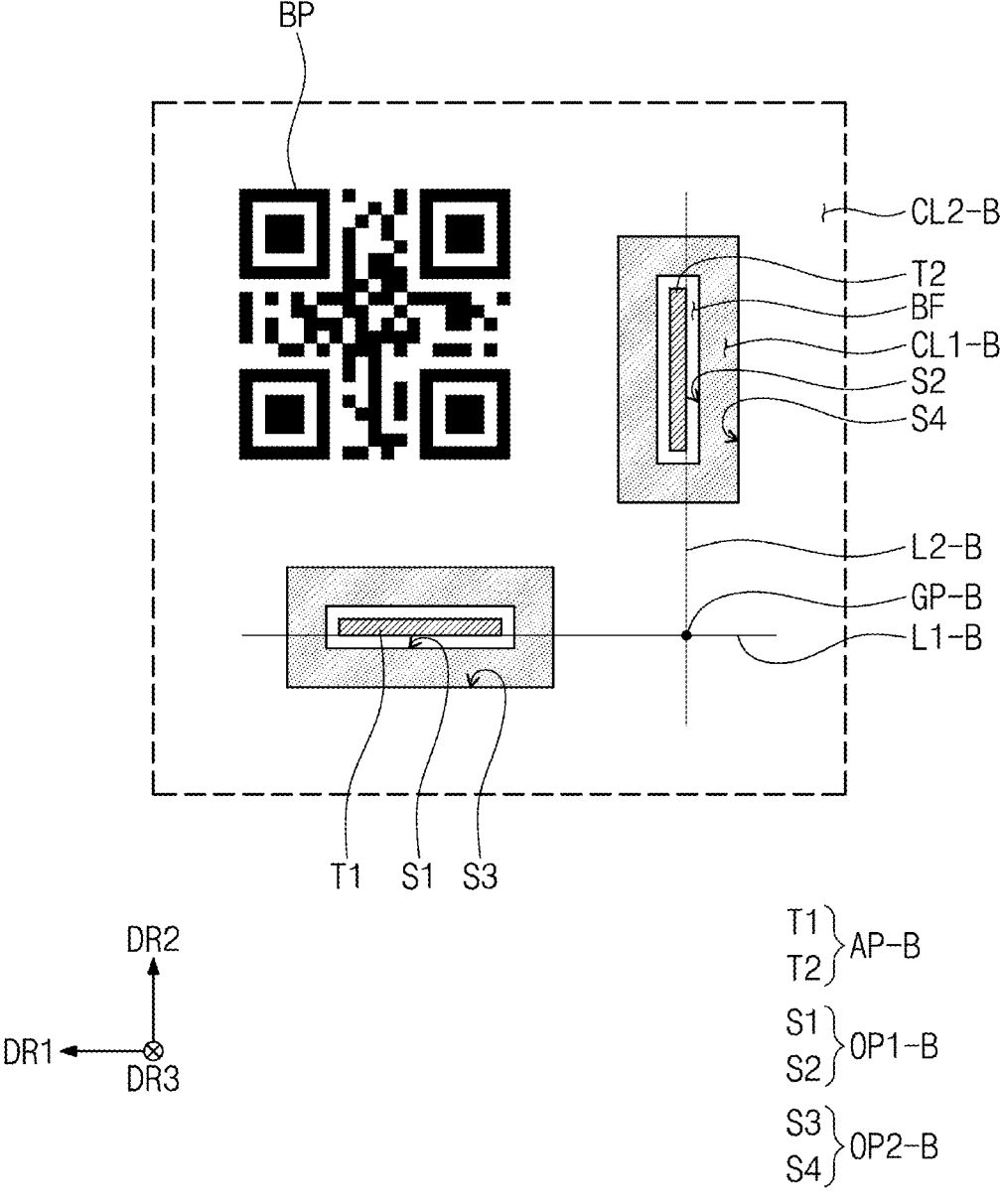
FIG. 8 is an enlarged plan view of some components of a display device according to an embodiment of the present disclosure.

FIG. 8 is an enlarged plan view of some components of a display device DD (refer to FIG. 1) according to an embodiment of the present disclosure. FIG. 8 is an enlarged plan view of an area corresponding to the area PP' shown in FIG. 3A. In FIG. 8, the same reference numerals denote the same elements in FIGS. 1 to 3C, and thus, detailed descriptions of the same elements will be omitted.

Referring to FIG. 8, an alignment pattern AP-B according to the present embodiment may be provided in plural. The alignment patterns AP-B may include a first pattern T1 and a second pattern T2 disposed spaced apart from the first pattern T1 in a plan view.

The first pattern T1 may have a rectangular shape extending in the first direction DR1. That is, the first pattern T1 may include long sides extending in the first direction DR1 and short sides extending in the second direction DR2. The first pattern T1 may be spaced apart from a barcode pattern BP in the second direction DR2. At least a portion of the first pattern T1 may overlap the barcode pattern BP in the second direction DR2.

The second pattern T2 may have a rectangular shape extending in the second direction DR2. That is, the second pattern T2 may include long sides extending in the second direction DR2 and short sides extending in the first direction DR1. The second pattern T2 may be spaced apart from the barcode pattern BP in the first direction DR1. At least a portion of the second pattern T2 may overlap the barcode pattern BP in the first direction DR1.

According to an embodiment, a length in the first direction DR1 of the first pattern T1 may be equal to or greater than about 0.2 mm and equal to or smaller than about 2.0 mm. A length in the second direction DR2 of the second pattern T2 may be equal to or greater than about 0.2 mm and equal to or smaller than about 2.0 mm.

According to an embodiment, a minimum separation distance between the first pattern T1 and the barcode pattern BP may be equal to or greater than about 1.0 mm in the second direction DR2. A minimum separation distance between the second pattern T2 and the barcode pattern BP may be equal to or greater than about 1.0 mm in the first direction DR1.

According to the present embodiment, a reference point GP-B provided by the alignment pattern AP-B may be defined as an intersection of a first reference line L1-B and a second reference line L2-B. The first reference line L1-B may be defined as an imaginary line extending along one of long sides extending in the first direction DR1 of the first pattern T1. The second reference line L2-B may be defined as an imaginary line extending along one of long sides extending in the second direction DR2 of the second pattern T2.

A first cover layer CL1-B may be provided with a plurality of first openings OP1-B defined therethrough. The first openings OP1-B may include a first sub-opening S1 and a second sub-opening S2.

The first pattern T1 may be exposed through the first sub-opening S1. An inner side surface I-1 (refer to FIG. 3C) of the first cover layer CL1-B, which defines the first sub-opening S1, may surround the first pattern T1. The second pattern T2 may be exposed through the second sub-opening S2. An inner side surface I-1 of the first cover layer CL1-B, which defines the second sub-opening S2, may surround the second pattern T2.

When viewed in a plane (e.g., in a plan view), the first sub-opening S1 may have a rectangular shape extending in the first direction DR1, and the second sub-opening S2 may have a rectangular shape extending in the second direction DR2. However, the shape of the first and second sub-openings S1 and S2 should not be limited thereto or thereby.

A second cover layer CL2-B may be provided with a plurality of second openings OP2-B defined therethrough. The second openings OP2-B may include a third sub-opening S3 and a fourth sub-opening S4.

The third sub-opening S3 may overlap the first sub-opening S1 in a plan view. When viewed in the plane, the third sub-opening S3 may have a size greater than a size of the first sub-opening S1. At least a portion of an upper surface U-1 (refer to FIG. 3C) of the first cover layer CL1-B may be exposed through the third sub-opening S3.

The fourth sub-opening S4 may overlap the second sub-opening S2 in a plan view. When viewed in the plane, the fourth sub-opening S4 may have a size greater than a size of the second sub-opening S2. At least a portion of the upper surface U-1 of the first cover layer CL1-B may be exposed through the fourth sub-opening S4.

When viewed in the plane (i.e., in a plan view), the third sub-opening S3 may have a rectangular shape extending in the first direction DR1, and the fourth sub-opening S4 may have a rectangular shape extending in the second direction DR2. However, the shape of the third and fourth sub-openings S3 and S4 should not be limited thereto or thereby.

FIGS. 9A to 9H are views showing processes of a method of manufacturing the display device DD (refer to FIG. 1) according to an embodiment of the present disclosure. The manufacturing method of the display device DD may include: providing the circuit board PCB, connecting the circuit board PCB to the display panel DP, bending the display panel DP, and forming the barcode pattern BP on the circuit board PCB. Hereinafter, each process of the manufacturing method will be described with reference to FIGS. 9A to 9H. In FIGS. 9A to 9H, the same/similar reference numerals denote the same/similar elements in FIGS. 1 to 8, and thus, detailed descriptions of the same/similar elements will be omitted.

Figure 9A:
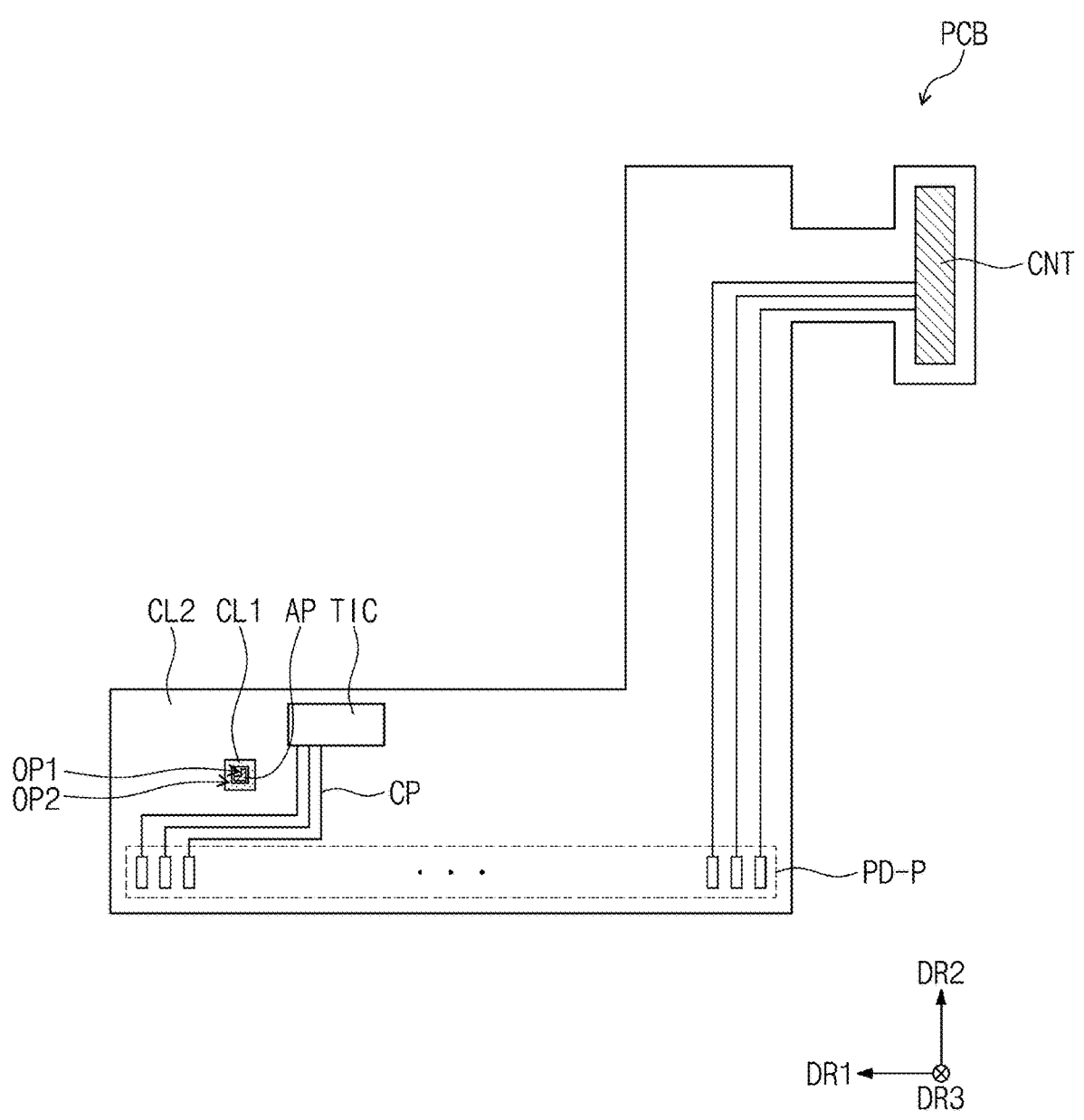
FIGS. 9A to 9H are views showing processes of a method of manufacturing a display device according to an embodiment of the present disclosure.

Referring to FIG. 9A, the manufacturing method of the display device DD may include the providing of the circuit board PCB.

The circuit board PCB may include the alignment pattern AP, the circuit pattern CP, the first cover layer CL1, and the second cover layer CL2. The alignment pattern AP may be exposed through the first opening OP1 (refer to FIG. 3B) of the first cover layer CL1 and the second opening OP2 (refer to FIG. 3B) of the second cover layer CL2.

The alignment pattern AP shown in FIG. 9A may include the first portion P1 (refer to FIG. 3B) extending in the first direction DR1 and the second portion P2 (refer to FIG. 3B) extending from the one end of the first portion P1 to the second direction DR2 when viewed in the plane (i.e., view in the third direction DR3), however, the shape of the alignment pattern AP should not be limited thereto or thereby. As other examples, the alignment pattern AP may have the shapes described with reference to FIGS. 4A to 5B and FIG. 8.

In addition, each of the first opening OP1 and the second opening OP2 shown in FIG. 9A may have the quadrangular shape in a plan view as a representative example, however, the shape of the first and second openings OP1 and OP2 should not be limited thereto or thereby. As another example, each of the first and second openings OP1 and OP2 may have the shape described with reference to FIG. 6.

Figure 9B:
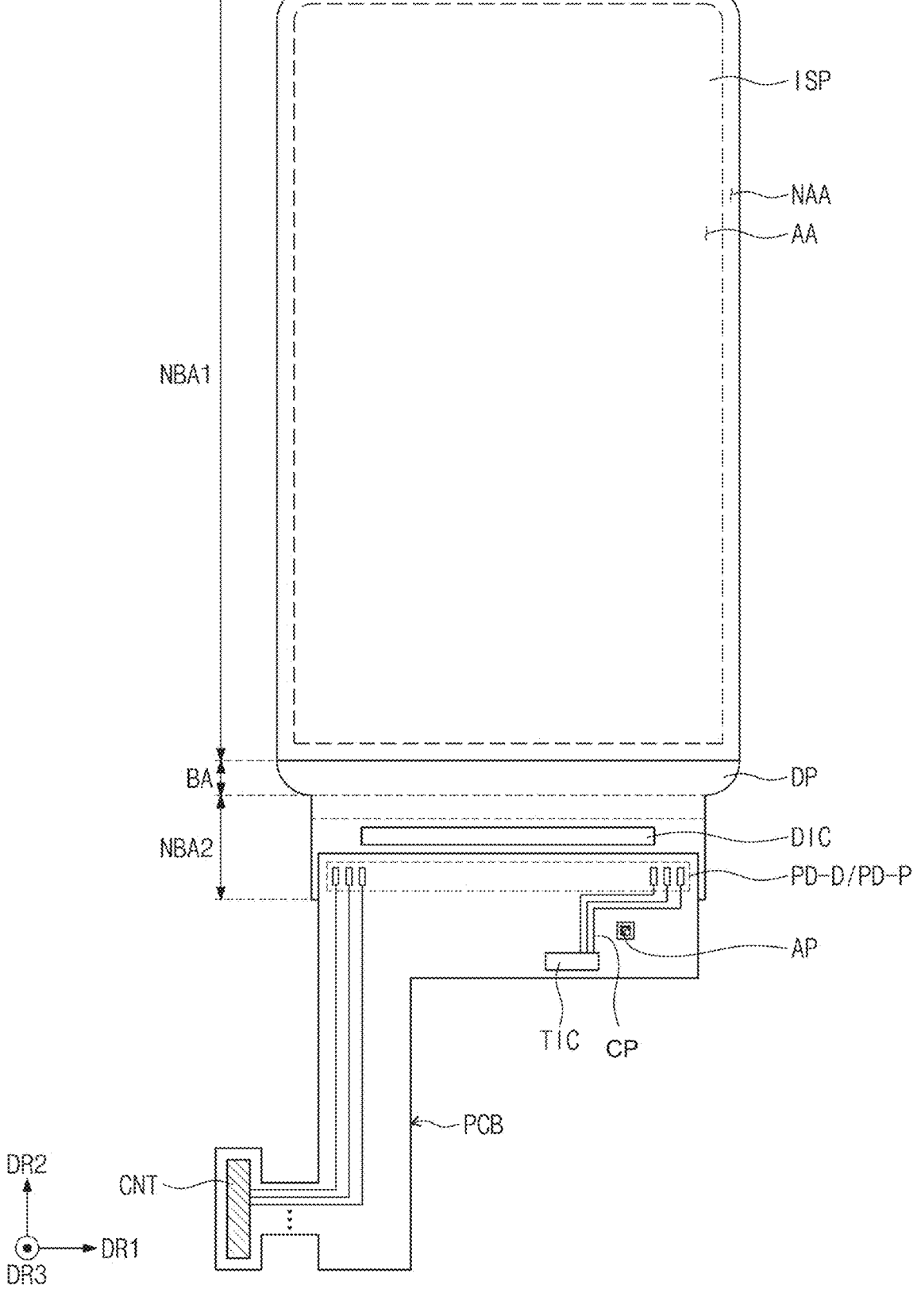

Referring to FIG. 9B, the manufacturing method of the display device DD may include the connecting of the circuit board PCB to the display panel DP.

The circuit board PCB may be disposed in the second non-bending area NBA2 of the display panel DP. As described above, the circuit board PCB may be disposed to allow the substrate pad part PD-P of the circuit board PCB to be connected to the display pad part PD-D of the display panel DP.

Figure 9C:
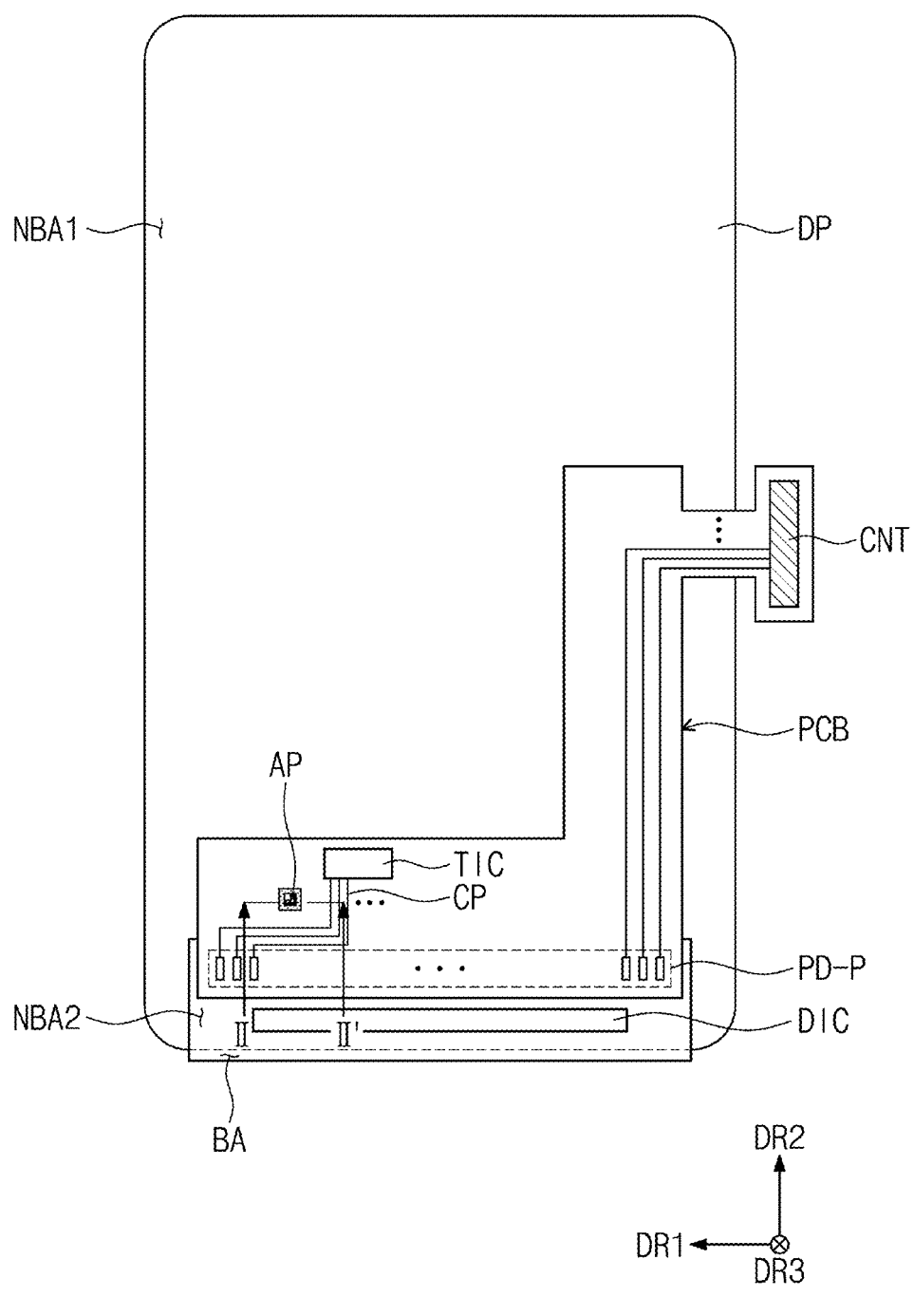

Referring to FIG. 9C, the manufacturing method of the display device DD may include the bending of the display panel DP.

The bending area BA of the display panel DP may be bent with respect to a predetermined axis extending in the first direction DR1 such that the second non-bending area NBA2 of the display panel DP may be disposed under the first non-bending area NBA1. Accordingly, the circuit board PCB may be disposed under the first non-bending area NBA1 of the display panel DP.

Figure 9D:
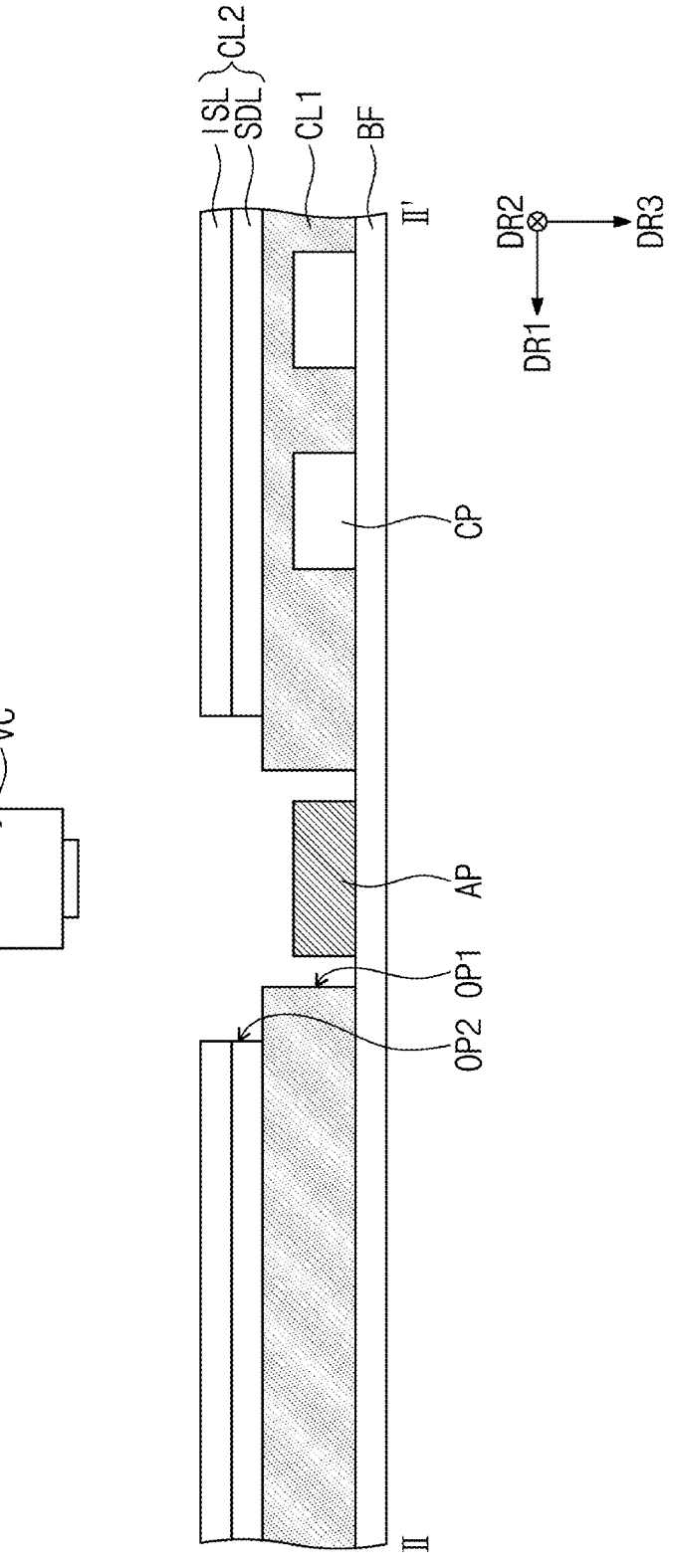
Figure 9E:
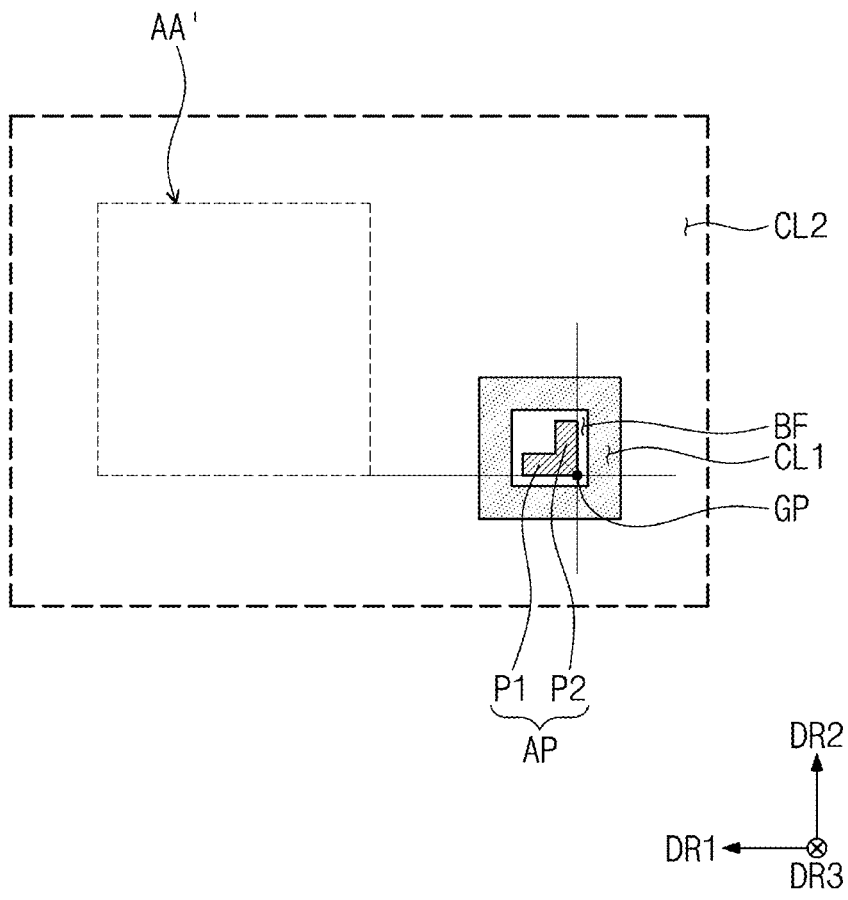
Figure 9F:
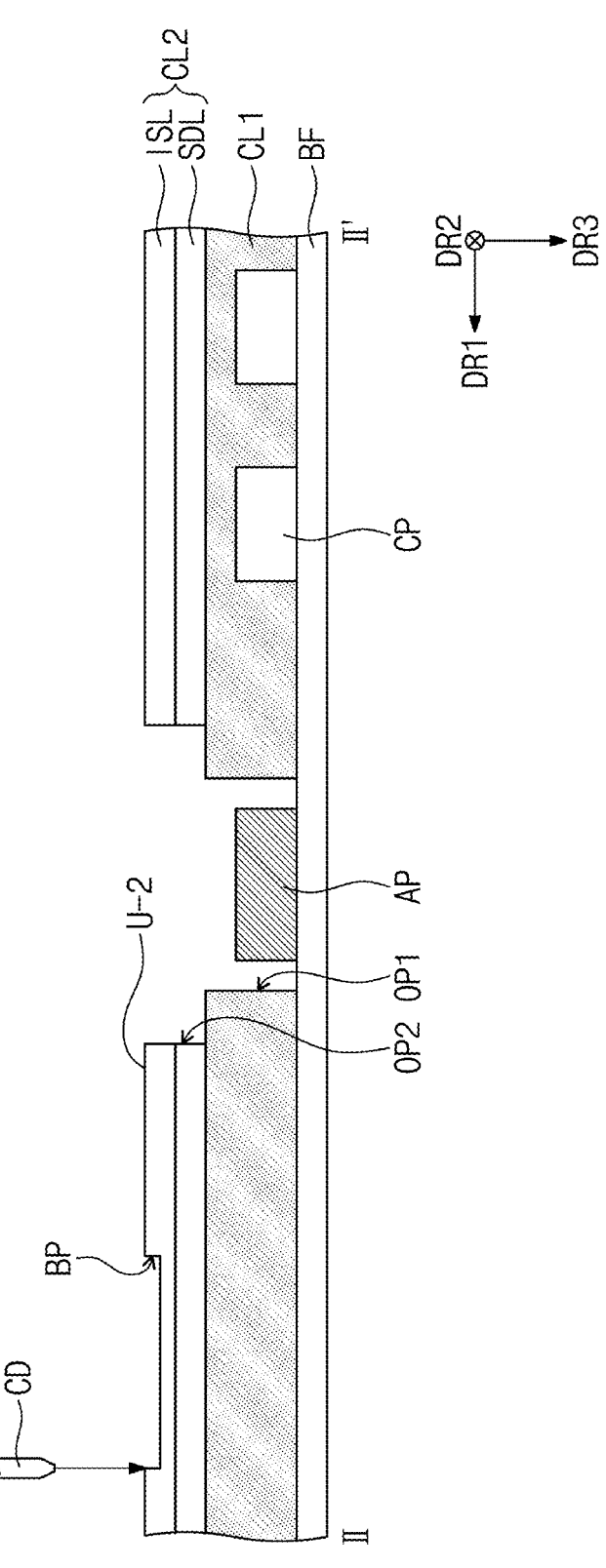
Figure 9G:
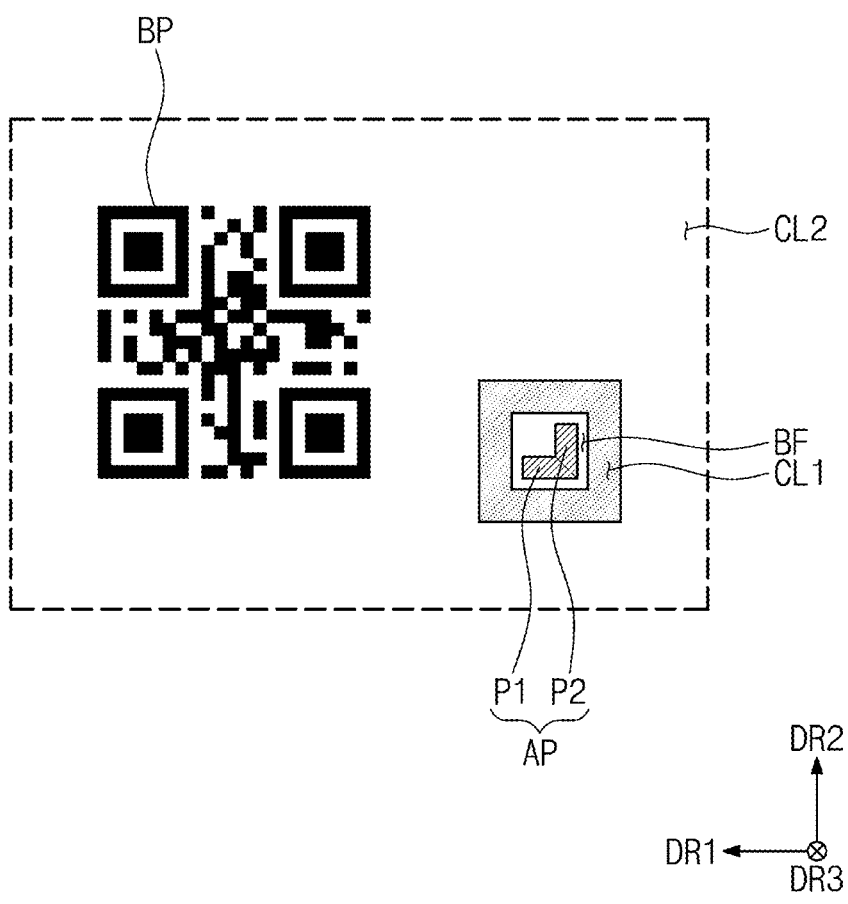

Referring to FIGS. 9D to 9H, the manufacturing method of the display device DD may include the forming of the barcode pattern BP on the circuit board PCB. FIGS. 9D and 9F are cross-sectional views taken along line II-II' of FIG. 9C. FIGS. 9E and 9G are enlarged plan views of an area of the circuit board PCB in which the alignment pattern AP is disposed.

According to an embodiment, the forming of the barcode pattern BP on the circuit board PCB may include setting the reference point GP with respect to the alignment pattern AP and recognizing the reference point GP to form the barcode pattern BP.

As shown in FIGS. 9D and 9E, the reference point GP may be set based on the alignment pattern AP using the vision camera VC. The reference point GP provided by the alignment pattern AP is as described with reference to FIGS. 3B and 4A to 8, and thus, details thereof will be omitted.

Then, as shown in FIGS. 9F and 9G, the barcode pattern BP may be formed based on the reference point GP recognized through the vision camera VC. A position of a setting area AA' (See FIG. 9E) at which the barcode pattern BP is to be formed may be determined by coordinates predetermined with respect to the distance spaced apart from the reference point GP in a plan view.

According to an embodiment, the barcode pattern BP may be formed by the laser process. The carving device CD may irradiate the laser beam onto the upper surface U-2 of the insulating layer ISL of the second cover layer CL2 to form a pattern corresponding to the barcode pattern BP, which is to be formed.

The carving device CD may irradiate the laser beam along the pattern corresponding to the barcode pattern BP, and the barcode pattern BP may be defined as a portion obtained by removing at least a portion of the insulating layer ISL, however, this is merely an example. According to an embodiment, the carving device CD may irradiate the laser beam to a remaining portion except the barcode pattern BP, and the barcode pattern BP may be defined as the remaining portion of the insulating layer ISL except the portion obtained by removing at least the portion of the insulating layer ISL.

Figure 9H:
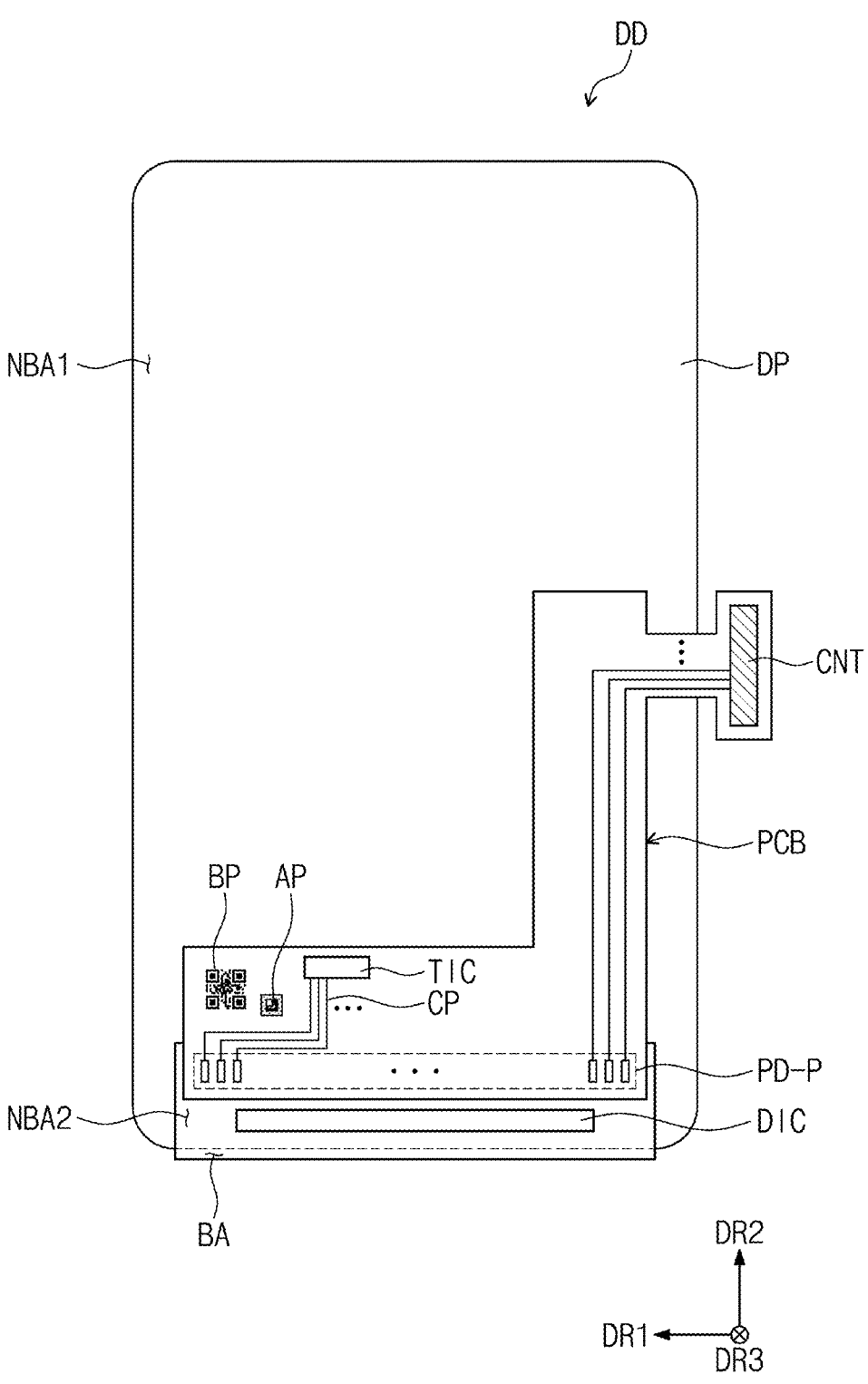

Then, as shown in FIG. 9H, the display device DD including the circuit board PCB in which the barcode pattern BP is formed is manufactured.

FIGS. 10A to 10D are views showing processes of a method of manufacturing the display device DD (refer to FIG. 1) according to an embodiment of the present disclosure. The manufacturing method of the display device DD may further include manufacturing the circuit board PCB before the providing of the circuit board PCB. Hereinafter, the manufacturing method of the circuit board PCB will be described with reference to FIGS. 10A to 10D. In FIGS. 10A to 10D, the same/similar numerals denote the same/similar elements in FIGS. 1 to 8, and thus, detailed descriptions of the same/similar elements will be omitted.

Figures 10A, 10B:
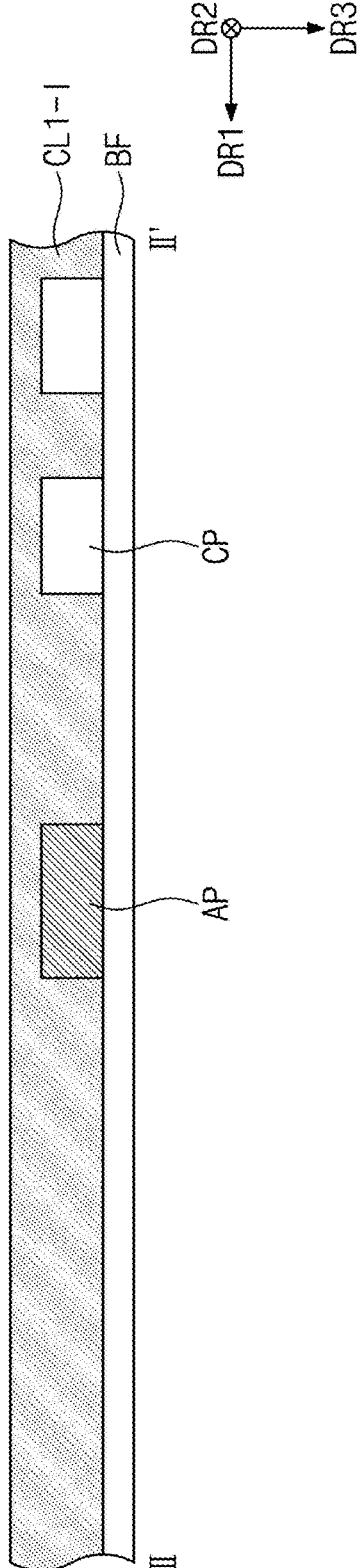

Referring to FIG. 10A, the manufacturing method of the circuit board PCB may include forming the alignment pattern AP on the base layer BF.

The alignment pattern AP and the circuit pattern CP may be formed on the base layer BF through the same process. As an example, the alignment pattern AP and the circuit pattern CP may be substantially simultaneously formed by providing a conductive material, for example, a metal material, on the base layer BF and performing an etching process on the conductive material.

Different from the present disclosure, in a case where the alignment pattern AP is formed through a silk printing process, an accuracy of the alignment pattern AP is determined according to a quality of an ink and a quality of a printing device. The alignment pattern AP formed by the silk printing process has a non-uniform width, is partially disconnected, or is partially smeared, and thus, the accuracy of the alignment pattern AP decreases. Accordingly, a defect rate in recognizing the alignment pattern AP through the vision camera VC described with reference to FIG. 9D increases, and the accuracy of the barcode pattern BP also decreases.

However, according to the present disclosure, as the alignment pattern AP is formed by the etching process rather than the printing process, the accuracy of the alignment pattern AP may be improved. That is, the accuracy of the alignment pattern AP may be prevented from decreasing due to the quality of the metal material and the quality of the printing device. Accordingly, as the defect rate in recognition of the vision camera VC (refer to FIG. 9D) with respect to the reference point GP (refer to FIG. 9E) may decrease, a process time may be shortened and a facility operation rate may increase in a process of forming the barcode pattern BP and a process of recognizing the barcode pattern BP.

In addition, according to an embodiment, since an ink is not used additionally during the forming of the alignment pattern AP, a manufacturing cost may be reduced.

Referring to FIG. 10B, the manufacturing method of the circuit board PCB may include forming a first preliminary cover layer CL1-I on the base layer BF. The first preliminary cover layer CL1-I may be disposed on the base layer BF and may cover the alignment pattern AP and the circuit pattern CP.

Figures 10C, 10D:
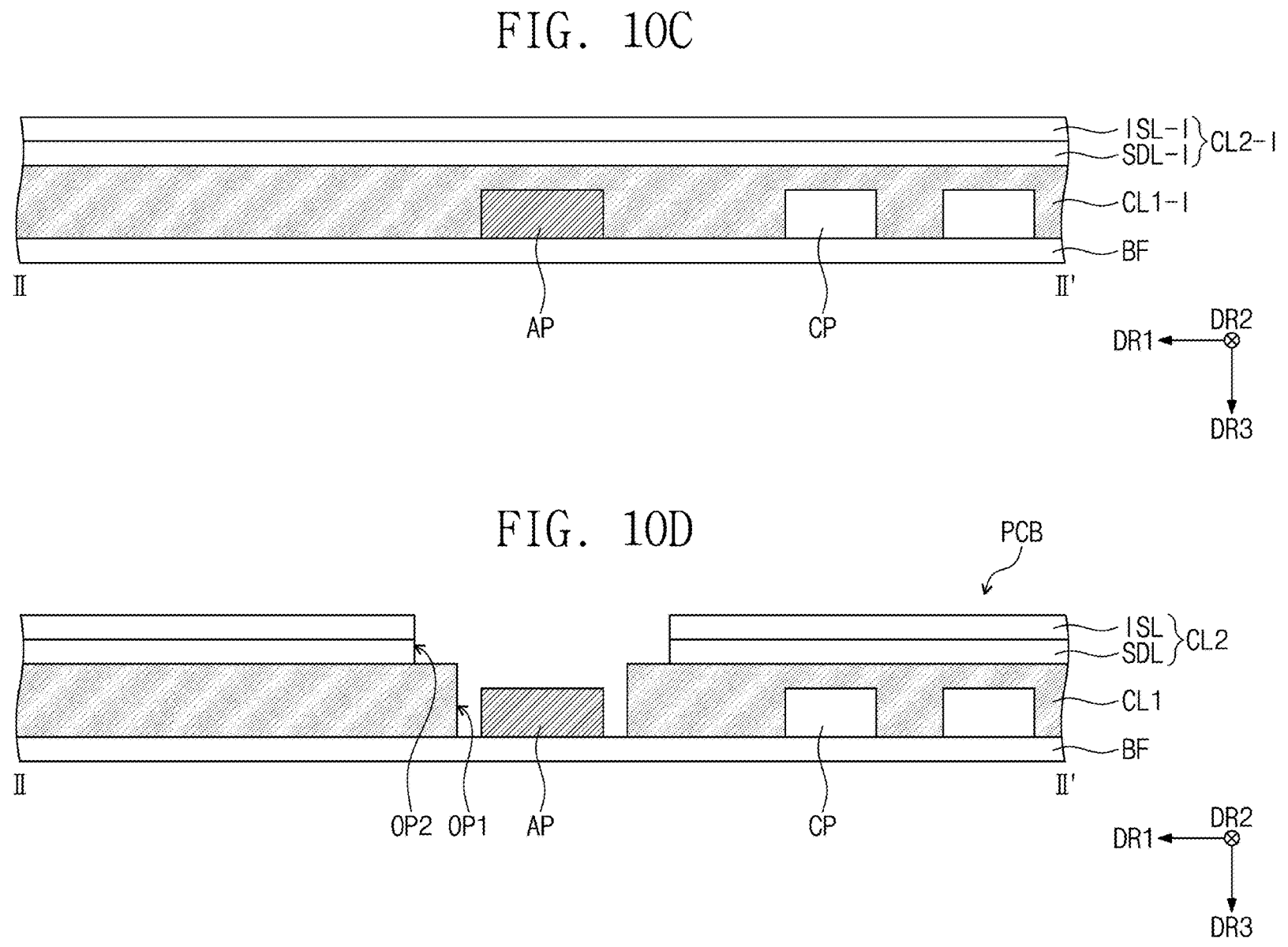

Referring to FIG. 10C, the manufacturing method of the circuit board PCB may include forming a second preliminary cover layer CL2-I on the first preliminary cover layer CL1-I.

The forming of the second preliminary cover layer CL2-I may include forming a preliminary shielding layer SDL-I on the first preliminary cover layer CL1-I and forming a preliminary insulating layer ISL-I on the preliminary shielding layer SDL-I.

Referring to FIG. 10D, the manufacturing method of the circuit board PCB may include forming the first opening OP1 and the second opening OP2 through the first preliminary cover layer CL1-I and the second preliminary cover layer CL2-I, respectively.

The first opening OP1 may be formed through the first preliminary cover layer CL1-I, and thus, the first cover layer CL1 that allows the alignment pattern AP to be exposed through the first opening OP1 may be formed. The second opening OP2 may be formed through the second preliminary cover layer CL2-I, and thus, the second cover layer CL2 that allows the upper surface of the first cover layer CL1 to be exposed through the second opening OP2 may be formed.

The circuit board PCB corresponding to that of FIG. 9A may be manufactured through the processes of FIGS. 10A to 10D.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A display device comprising:
   a display panel; and
   a circuit board connected to the display panel, the circuit board comprising:
   a base layer;
   a circuit pattern disposed on the base layer and electrically connected to the display panel;
   an alignment pattern disposed on the base layer and comprising a same material as the circuit pattern;
   a first cover layer disposed on the base layer, covering the circuit pattern, and provided with a first opening defined therethrough to expose the alignment pattern; and
   a second cover layer disposed on the first cover layer, provided with a second opening defined therethrough and overlapping the first opening, and comprising a barcode pattern defined on a surface of the second cover layer opposite to the first cover layer,
   wherein the first cover layer overlapping the second opening is exposed through the second opening without being covered by the second cover layer.

2. The display device of claim 1, wherein the alignment pattern is spaced apart from the first cover layer, and a part of the base layer overlapping the first opening is exposed through the first opening without being covered by the first cover layer.

3. The display device of claim 1, wherein the alignment pattern has a brightness different from a brightness of the base layer.

4. The display device of claim 1, wherein an inner side surface of the first cover layer, which defines the first opening, surrounds the alignment pattern.

5. The display device of claim 1, wherein the alignment pattern has at least one of a circular shape and a polygonal shape in a plan view, and the polygonal shape comprises a first side and a second side perpendicular to the first side.

6. The display device of claim 1, wherein the alignment pattern is provided in plural, the alignment patterns comprise a first pattern extending in a first direction and a second pattern extending in a second direction crossing the first direction and spaced apart from the first pattern, at least a portion of the first pattern overlaps the barcode pattern in the second direction, and at least a portion of the second pattern overlaps the barcode pattern in the first direction.

7. The display device of claim 6, wherein each of the first opening and the second opening is provided in plural, the first openings comprise a first sub-opening through which the first pattern is exposed and a second sub-opening through which the second pattern is exposed, and the second openings comprise a third sub-opening overlapping the first sub-opening and a fourth sub-opening overlapping the second sub-opening.

8. The display device of claim 1, wherein each of the first opening and the second opening has one of a quadrangular shape, a pentagon shape, and a circular shape in a plan view.

9. The display device of claim 1, wherein each of the circuit pattern and the alignment pattern comprises a metal material.

10. The display device of claim 1, wherein the first cover layer comprises an organic insulating material.

11. The display device of claim 1, wherein the second cover layer comprises:

a shielding layer disposed on the first cover layer and comprising a metal material; and an insulating layer disposed on the shielding layer and comprising an organic insulating material.

12. The display device of claim 11, wherein the barcode pattern is defined by a portion of the insulating layer, which is exposed by removing at least a portion of the insulating layer.

* * * * *